United States Patent
Ciccarelli et al.

(10) Patent No.: US 6,498,926 B1
(45) Date of Patent: Dec. 24, 2002

(54) PROGRAMMABLE LINEAR RECEIVER HAVING A VARIABLE IIP3 POINT

(75) Inventors: Steven C. Ciccarelli, Encinitas, CA (US); Saed G. Younis, San Diego, CA (US); Ralph E. Kaufman, La Mesa, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 08/987,305

(22) Filed: Dec. 9, 1997

(51) Int. Cl.$^7$ .................................................. H04B 1/06
(52) U.S. Cl. ............................. 455/240.1; 455/239.1; 455/234.1; 455/245.1; 455/245.2; 455/249.1; 330/129
(58) Field of Search .......................... 455/239.1, 240.1, 455/241.1, 242.1, 245.1, 245.2, 250.1, 244.1, 234.1, 249.1; 375/345; 330/129, 149

(56) References Cited

U.S. PATENT DOCUMENTS

| | | | |
|---|---|---|---|
| 4,857,928 A | 8/1989 | Gailus et al. ................ | 341/143 |
| 5,001,725 A | 3/1991 | Senderowicz et al. ........ | 375/28 |
| 5,283,578 A | 2/1994 | Ribner et al. ................ | 341/143 |
| 5,311,181 A | 5/1994 | Ferguson, Jr. et al. ....... | 341/143 |
| 5,345,406 A | 9/1994 | Williams ..................... | 364/724 |
| 5,430,890 A | 7/1995 | Vogt et al. ................. | 455/180.3 |
| 5,432,779 A | 7/1995 | Shimo et al. ................. | 370/30 |
| 5,477,481 A | 12/1995 | Kerth ......................... | 364/825 |
| 5,483,691 A * | 1/1996 | Heck et al. ............... | 455/241.1 |
| 5,500,645 A | 3/1996 | Ribner et al. ............... | 341/143 |
| 5,507,023 A * | 4/1996 | Suganuma et al. ....... | 455/250.1 |
| 5,517,689 A | 5/1996 | Hayashihara ............... | 455/205 |
| 5,550,869 A | 8/1996 | Gurantz et al. ............. | 375/340 |
| 5,557,642 A | 9/1996 | Williams .................... | 375/316 |

(List continued on next page.)

FOREIGN PATENT DOCUMENTS

| EP | 0643477 | 9/1994 | ............ H03D/7/16 |
|---|---|---|---|
| EP | 0673125 | 9/1994 | ........... H04B/1/707 |

(List continued on next page.)

OTHER PUBLICATIONS

"A Comparison of Modulator Networks for High Order Oversampled E∇Analog–to Digital Converters" Ribner, IEEE Transactions on Circuits and Systems, vol. 38, No. 2, Feb. 1991.

(List continued on next page.)

*Primary Examiner*—Nguyen Vo
*Assistant Examiner*—Eliseo Ramos-Feliciano
(74) *Attorney, Agent, or Firm*—Philip R. Wadsworth; Tom Streeter

(57) ABSTRACT

A programmable linear receiver which provides the requisite level of system performance at reduced power consumption. The receiver minimizes power consumption based on measurement of the non-linearity in the output signal from the receiver. The amount of non-linearity can be measured by the RSSI slope or energy-per-chip-to-noise-ratio (Ec/Io) measurement. The RSSI slope is the ratio of the change in the output signal plus intermodulation to the change in the input signal. The input signal level is periodically increased by a predetermined level and the output signal from the receiver is measured. The output signal comprises the desired signal and intermodulation products from non-linearity within the receiver. When the receiver is operating linearly, the output signal level increases dB per dB with the input signal level. However, as the receiver transitions into non-linear region, intermodulation products due to non-linearity increase faster than the desired signal. By detecting the RSSI slope, the amount of degradation due to non-linearity can be determined. This information is then used to adjust the IIP3 operating point of the amplifiers and mixer to provide the requisite level of performance while minimizing power consumption.

31 Claims, 13 Drawing Sheets

U.S. PATENT DOCUMENTS

| | | | | |
|---|---|---|---|---|
| 5,568,144 A | | 10/1996 | Chiao et al. ................. | 341/139 |
| 5,572,264 A | * | 11/1996 | Mizukami et al. ........ | 455/245.2 |
| 5,574,457 A | | 11/1996 | Garrity et al. .............. | 341/172 |
| 5,590,411 A | * | 12/1996 | Sroka et al. ................... | 455/78 |
| 5,621,345 A | | 4/1997 | Lee et al. .................... | 327/254 |
| 5,623,432 A | | 4/1997 | Degrauwe ................... | 364/707 |
| 5,729,230 A | | 3/1998 | Jensen et al. ............... | 341/143 |
| 5,734,683 A | | 3/1998 | Hulko et al. ................ | 375/316 |
| 5,745,847 A | * | 4/1998 | Matsuo ..................... | 455/245.1 |
| 5,758,271 A | * | 5/1998 | Rich et al. ............... | 455/234.1 |
| 5,764,171 A | | 6/1998 | Stikvoort .................... | 341/143 |
| 5,809,400 A | * | 9/1998 | Abramsky et al. .......... | 330/129 |
| 5,907,798 A | * | 5/1999 | Abramsky et al. ........ | 455/249.1 |

FOREIGN PATENT DOCUMENTS

| | | | | |
|---|---|---|---|---|
| EP | 0641085 | 3/1995 | .......... | H03M/3/032 |
| EP | 0814568 | 12/1997 | ............ | H04B/1/10 |
| GB | 2258122 | 7/1992 | ............ | H04B/1/10 |
| WO | 9307679 | 4/1993 | ............ | H03M/3/00 |
| WO | 9619048 | 6/1996 | .......... | H04B/7/005 |
| WO | 9624193 | 8/1996 | ............ | H03M/1/18 |

OTHER PUBLICATIONS

"A High Frequency and High Resolution Fourth Order E∇ A/D Converter in BiCMOS Technologyu", Yin et al., IEEE Journal on Solid State Circuits, vol. 29 No. 8 Aug. 1994.

"An 81–MHz IF Receiver in CMOS", Hairapetian, IEEE Journal on Solid State Circuits, vol. 31, No. 12, pp. 1981–1986, Dec. 1996.

"Low Voltage Double Sampled E∇ Converters", Senderowicz et al., IEEE Journal on Solid State Circuits, vol. 32, No. 12, Dec. 1997.

"A Novel Double Sampling Technique for Delta–Sigma Modulators", Yang et al., Dept. of Electrical Engineering Technical University of Nova Scotia, published Mar. 8, 1994 (4 pgs).

"A 40 MHz IF Fourth–Order Double Sampled SC Bandpass E∇ Modulator", Bazarjani et al., IEEE Int'l Symposium on Circuits and Systems, Jun. 9–12, 1997 Hong Kong, pp. 73–76.

"A Third Order Sigma Delta Modulator with Extended Dynamic Range", Williams et al., IEEEE Journal on Solid State Circuits, vol. 29, Mar. 1994.

PhD Thesis of Seyfi Bazarjani entitled "Mixed Analog–Digital Design Considerations in Deep Submicron CMOS Technologies" presented Jul. 24, 1996 to Ottawa Carleton Institute for Electrical Engineering.

* cited by examiner

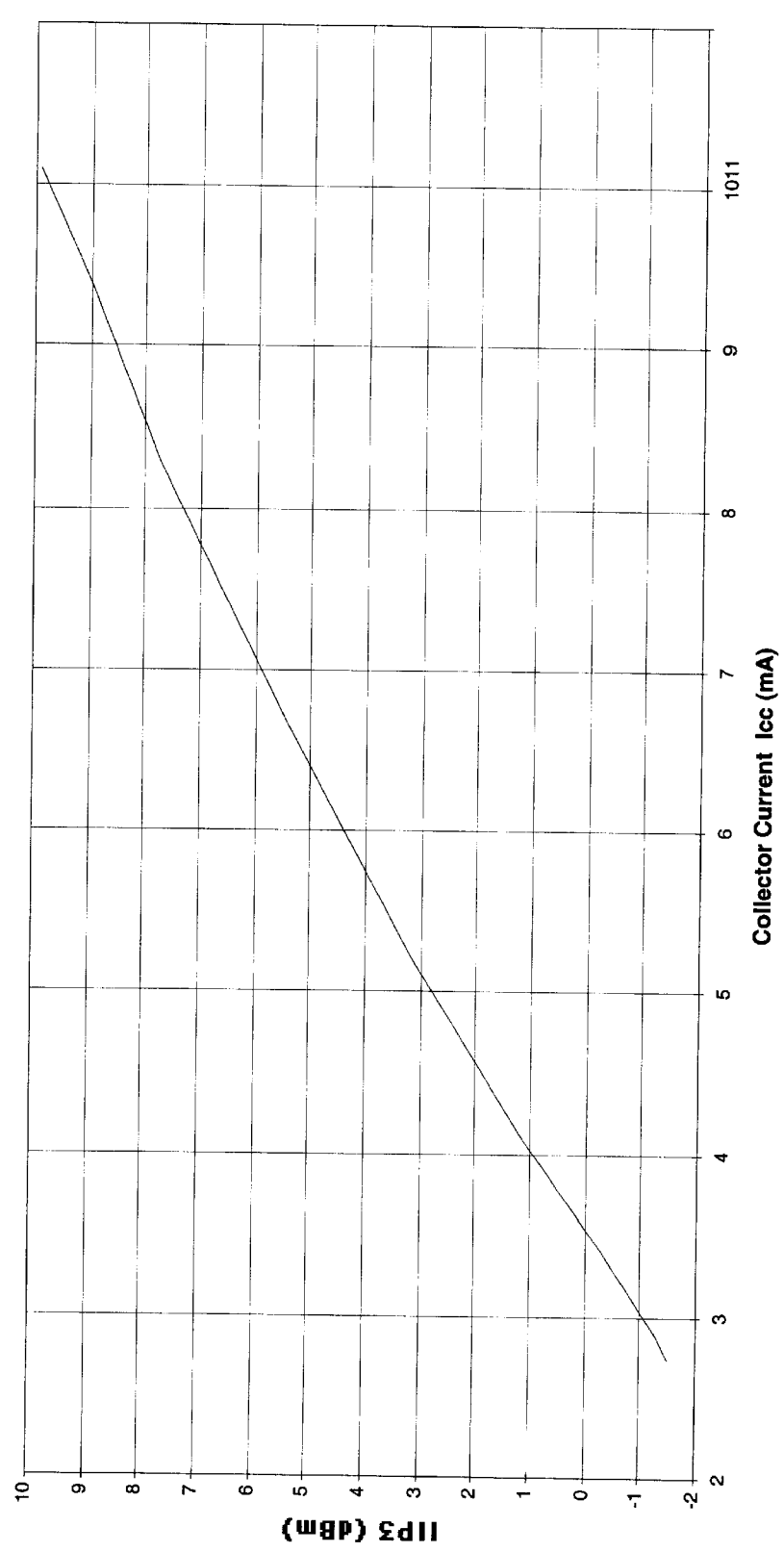
FIG. 6A - IIP3 of LNA vs. Collector Bias Current Icc

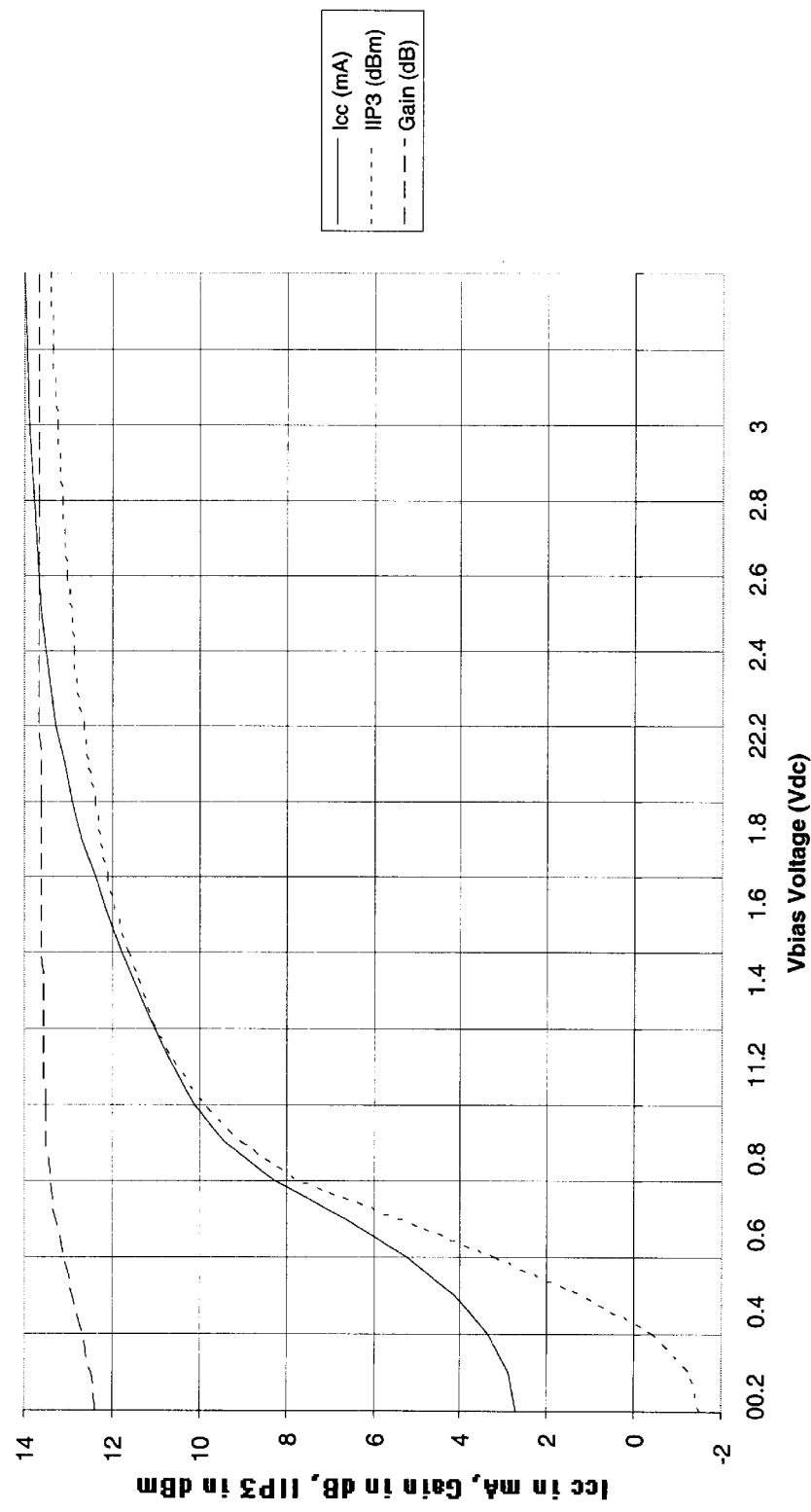

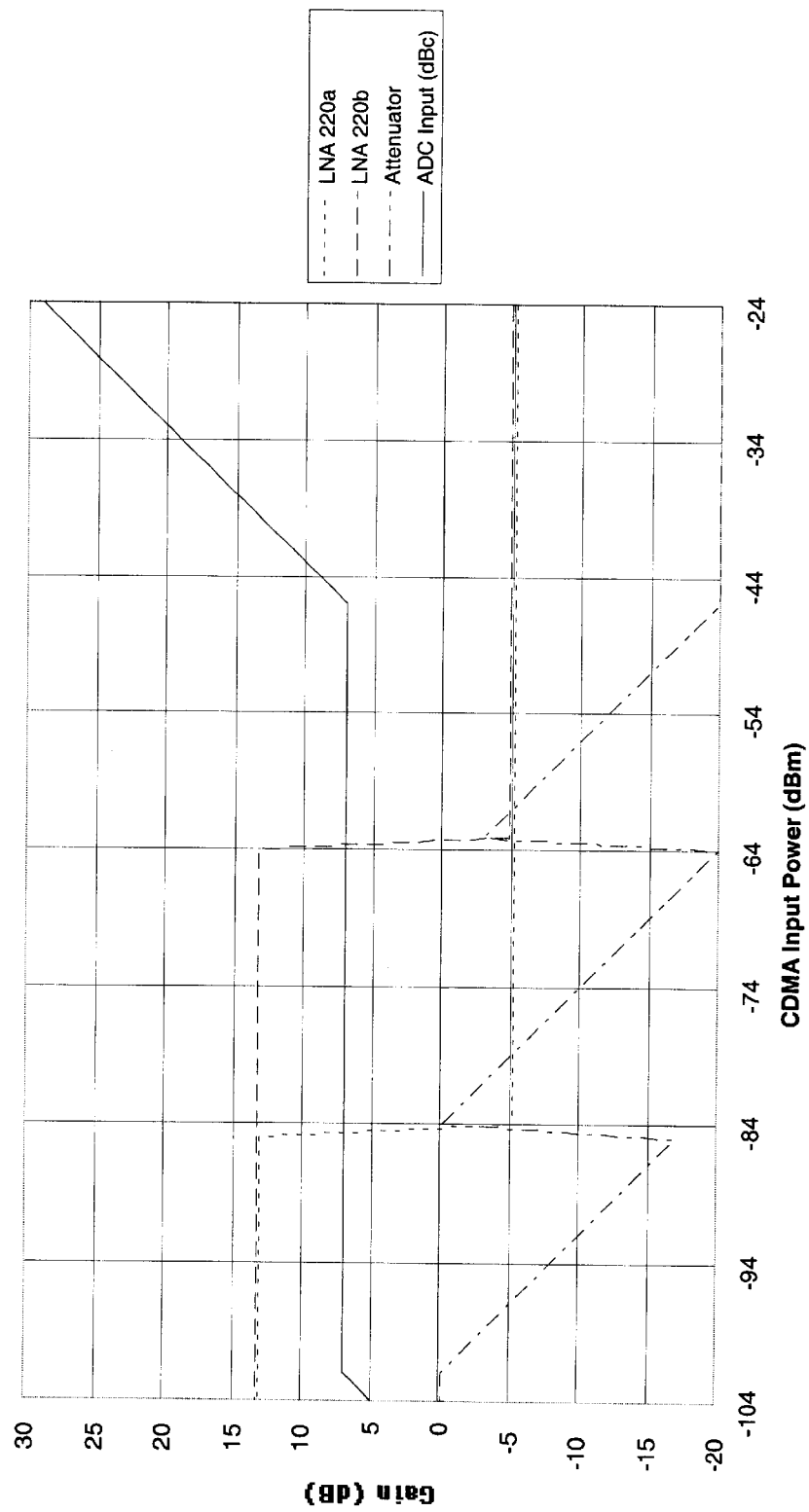
FIG. 8A - AGC Range (Ascending Power)

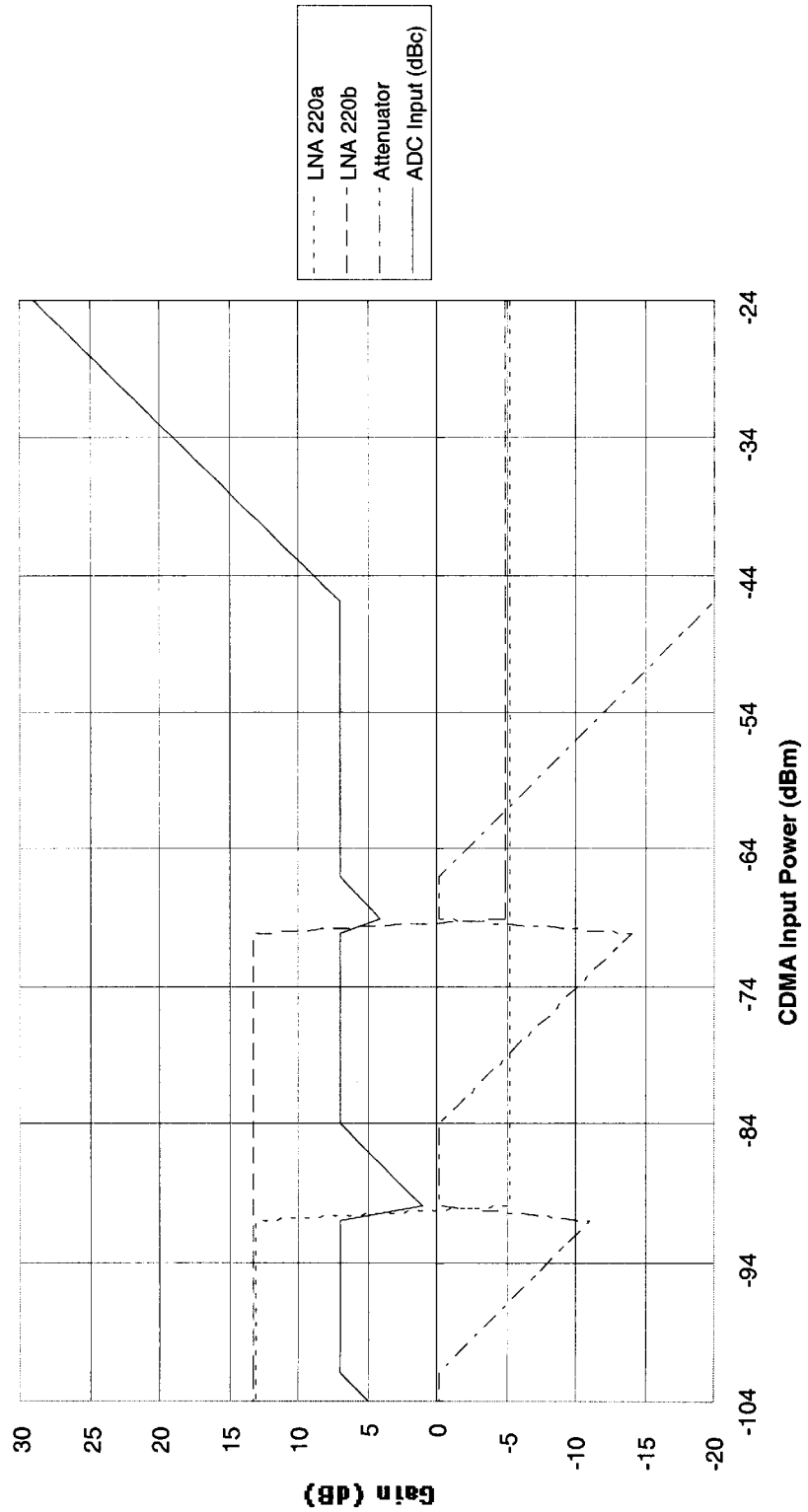
FIG. 8B - AGC Range (Descending Power)

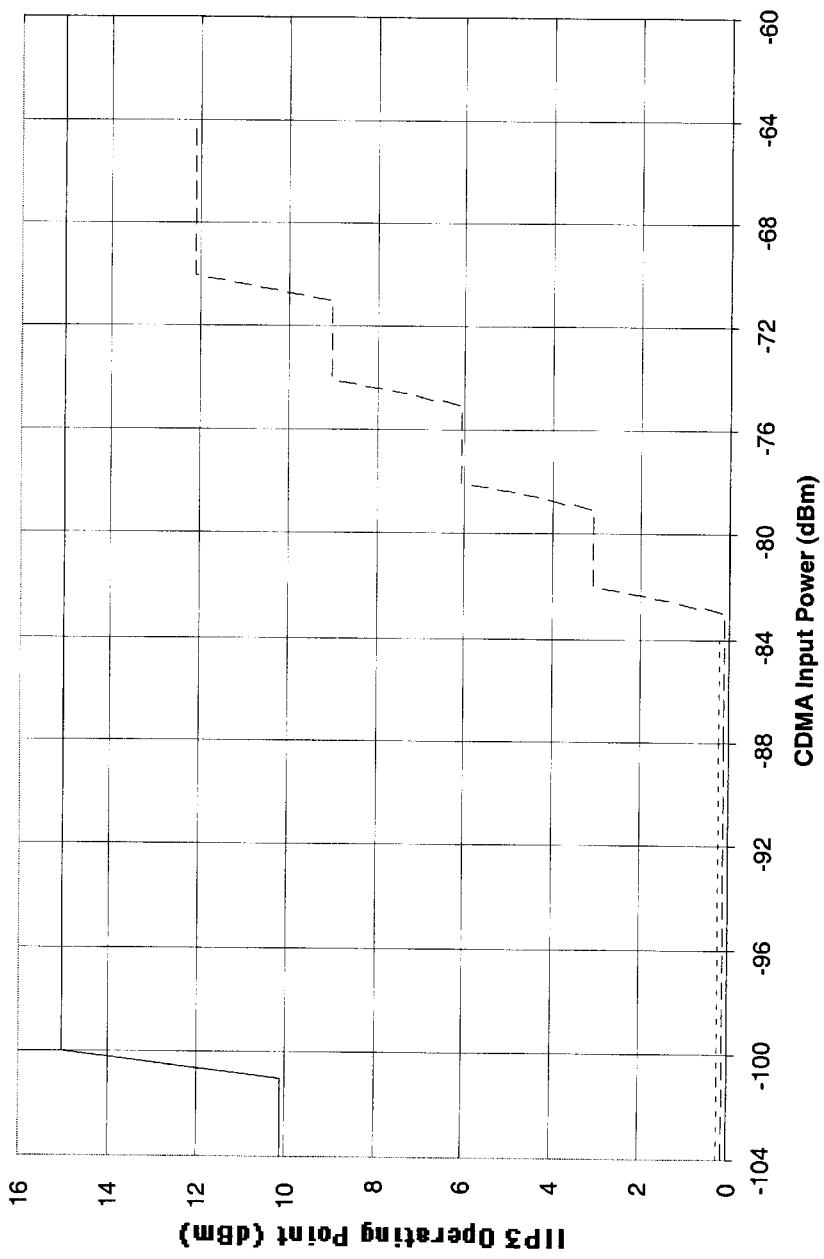

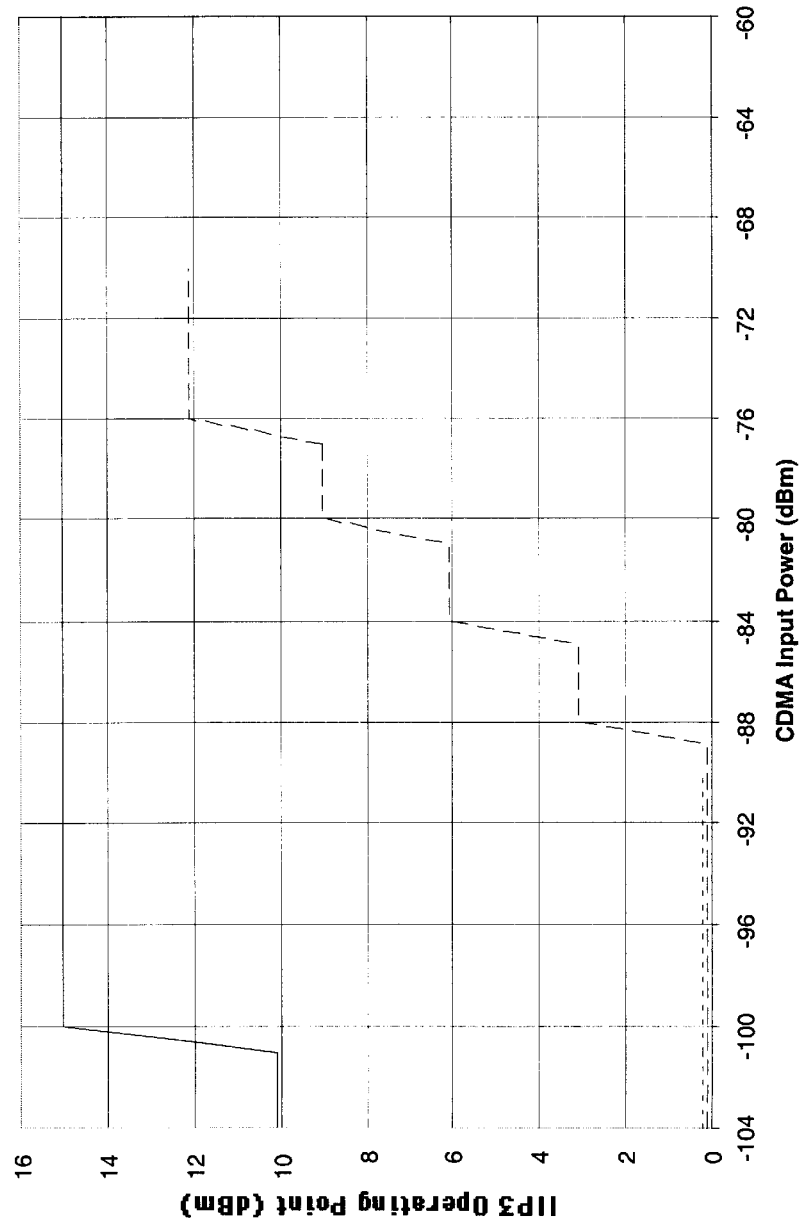
FIG. 10B - IP3 Bias Control (Descending Power)

PROGRAMMABLE LINEAR RECEIVER HAVING A VARIABLE IIP3 POINT

BACKGROUND OF THE INVENTION

I. Field of the Invention

The present invention relates to communications. More particularly, the present invention relates to a novel and improved programmable linear receiver.

II. Description of the Related Art

The design of a high performance receiver is made challenging by various design constraints. First, high performance is required for many applications. High performance can be described by the linearity of the active devices (e.g. amplifiers, mixers, etc.) and the noise figure of the receiver. Second, for some applications such as in a cellular communication system, power consumption is an important consideration because of the portable nature of the receiver. Generally, high performance and high efficiency are conflicting design considerations.

An active device has the following transfer function:

$$y(x) = a_1 \cdot x + a_2 x^2 + a_3 x^3 + \text{higher order terms}, \quad (1)$$

where x is the input signal, y(x) is the output signal, and $a_1$, $a_2$, and $a_3$ are coefficients which define the linearity of the active device. For simplicity, higher order terms (e.g. terms above third order) are ignored. For an ideal active device, the coefficients $a_2$ and $a_3$ are 0.0 and the output signal is simply the input signal scaled by $a_1$. However, all active devices experience some amount of non-linearity which is quantified by the coefficients $a_2$ and $a_3$. Coefficient $a_2$ defines the amount of, second order non-linearity and coefficient $a_3$ defines the amount of third order non-linearity.

Most communication systems are narrow band systems which operate on an input RF signal having a predetermined bandwidth and center frequency. The input RF signal typically comprises other spurious signals located throughout the frequency spectrum. Non-linearity within the active devices causes intermodulation of spurious signals, resulting in products which may fall into the signal band.

The effect of second order non-linearity (e.g. those caused by the $x^2$ term) can usually be reduced or eliminated by careful design methodology. Second order non-linearity produces products at the sum and difference frequencies. Typically, the spurious signals which can produce in-band second-order products are located far away from the signal band and can be easily filtered. However, third order non-linearity are more problematic. For third order non-linearity, spurious signals $x = g_1 \cdot \cos(w_1 t) + g_2 \cos(w_2 t)$ produce products at the frequencies $(2w_1 - w_2)$ and $(2w_2 - w_1)$. Thus, near band spurious signals (which are difficult to filter) can produce third order intermodulation products falling in-band, causing degradation in the received signal. To compound the problem, the amplitude of the third order products are scaled by $g_1 \cdot g_2^2$ and $g_1^2 \cdot g_2$. Thus, every doubling of the amplitude of the spurious signals produces an eight-fold increase in the amplitude of the third order products. Viewed another way, every 1 dB increase in the input RF signal results in 1 dB increase in the output RF signal but 3 dB increase in the third order products.

The linearity of a receiver (or the active device) can be characterized by the input-referred third-order intercept point (IIP3). Typically, the output RF signal and the third-order intermodulation products are plotted versus the input RF signal. As the input RF signal is increased, the IIP3 is a theoretical point where the desired output RF signal and the third-order products become equal in amplitude. The IIP3 is an extrapolated value since the active device goes into compression before the IIP3 point is reached.

For a receiver comprising multiple active devices connected in cascade, the IIP3 of the receiver from the first stage of active device to the $n^{th}$ stage can be calculated as follows:

$$IIP3_n = -10 \cdot \log_{10}[10^{-IIP3_{n-1}/10} + 10^{(Av_n - IIP3_{dn})/10}], \quad (2)$$

where $IIP3_n$ is the input-referred third-order intercept point from the first stage of active device to the $n^{th}$ stage, $IIP3_{n-1}$ is the input-referred third-order intercept point from the first stage to the $(n-1)^{th}$ stage, $Av_n$ is the gain of the $n^{th}$ stage, $IIP3_{dn}$ is the input-referred third-order intercept point of the $n^{th}$ stage, and all terms are given in decibel (dB). The calculation in equation (2) can be carried out in sequential order for subsequent stages within the receiver.

From equation (2), it can be observed that one way to improve the cascaded IIP3 of the receiver is to lower the gain before the first non-linear active device. However, each active device also generates thermal noise which degrades the signal quality. Since the noise level is maintained at a constant level, the degradation increases as the gain is lowered and the signal amplitude is decreased. The amount of degradation can be measured by the noise figure (NF) of the active device which is given as follows:

$$NF_d = SNR_{in} - SNR_{out}, \quad (3)$$

where $NF_d$ is the noise figure of the active device, $SNR_{in}$ is the signal-to-noise ratio of the input RF signal into the active device, $SNR_{out}$ is signal-to-noise ratio of the output RF signal from the active device, and $NF_d$, $SNR_{in}$ and $SNR_{out}$ are all given in decibel (dB). For a receiver comprising multiple active devices connected in cascade, the noise figure of the receiver from the first stage of active device to the $n^{th}$ stage can be calculated as follows:

$$NF_n = 10 \cdot \log_{10}\left[10^{(NF_{n-1}/10)} + \frac{10^{(NF_{dn}/10)} - 1}{10^{(G_{n-1}/10)}}\right], \quad (4)$$

where $NF_n$ is the noise figure from the first stage to the $n^{th}$ stage, $NF_{n-1}$ is the noise figure of the first stage to the $(n-1)^{th}$ stage, $NF_{dn}$ is the noise figure of the $n^{th}$ stage, and $G_{n-1}$ is the accumulated gain of the first stage through the $(n-1)^{th}$ stage in dB. As shown in equation (4), the gain of the active device can affect the noise figure of the subsequent stages. Similar to the IIP3 calculation in equation (2), the noise figure calculation in equation (4) can be carried out in sequential order for subsequent stages of the receiver.

Receivers are employed for many communication applications, such as cellular communication systems and high definition television (HDTV). Exemplary cellular communication systems include Code Division Multiple Access (CDMA) communication systems, Time Division Multiple Access (TDMA) communication systems, and analog FM communication systems. The use of CDMA techniques in a multiple access communication system is disclosed in U.S. Pat. No. 4,901,307, entitled "SPREAD SPECTRUM MULTIPLE ACCESS COMMUNICATION SYSTEM USING SATELLITE OR TERRESTRIAL REPEATERS", and U.S. Pat. No. 5,103,459, entitled "SYSTEM AND METHOD FOR GENERATING WAVEFORMS IN A CDMA CELLULAR TELEPHONE SYSTEM", both assigned to the assignee of the present invention and incorporated by reference herein. An exemplary HDTV system is disclosed in U.S. Pat. No. 5,452,104, U.S. Pat. No. 5,107,345, and U.S. Pat. No. 5,021,891, all three entitled "ADAPTIVE BLOCK SIZE IMAGE COMPRESSION METHOD AND SYSTEM", and U.S. Pat. No. 5,576,767, entitled "INTERFRAME VIDEO ENCODING AND DECODING SYSTEM", all four patents are assigned to the assignee of the present invention and incorporated by reference herein.

In cellular applications, it is common to have more than one communication system operating within the same geographic coverage area. Furthermore, these systems can operate at or near the same frequency band. When this occurs, the transmission from one system can cause degradation in the received signal of another system. CDMA is a spread spectrum communication system which spreads the transmit power to each user over the entire 1.2288 MHz signal bandwidth. The spectral response of an FM-based transmission can be more concentrated at the center frequency. Therefore, FM-based transmission can cause jammers to appear within the allocated CDMA band and very close to the received CDMA signal. Furthermore, the amplitude of the jammers can be many time greater than that of the CDMA signal. These jammers can cause third-order intermodulation products which can degrade the performance of the CDMA system.

Typically, to minimize degradation due to intermodulation products caused by jammers, the receiver is designed to have high IIP3. However, design of a high IIP3 receiver requires the active devices within the receiver to be biased with high DC current, thereby consuming large amounts of power. This design approach is especially undesirable for cellular application wherein the receiver is a portable unit and power is limited.

Several techniques have been deployed in the prior art to address the need for high IIP3. One such technique, which also attempts to minimize power consumption, is to implement the gain stage with a plurality of amplifiers connected in parallel and to selectively enable the amplifiers as higher IIP3 is needed. This technique is disclosed in detail in U.S. patent application Ser. No. 08/843,904, entitled "DUAL MODE AMPLIFIER WITH HIGH EFFICIENCY AND HIGH LINEARITY", filed Apr. 17, 1997; assigned to the assignee of the present invention and incorporated by reference herein. Another technique is to measure the received RF signal power and adjust the gain of the amplifiers based on the amplitude of the RF signal power. This technique is disclosed in detail in U.S. patent application Ser. No. 08/723,491, entitled "METHOD AND APPARATUS FOR INCREASING RECEIVER POWER IMMUNITY TO INTERFERENCE", filed Sep. 30, 1996, assigned to the assignee of the present invention and incorporated by reference herein. These techniques improve the IIP3 performance but have not effectively reduced power consumption nor minimized circuit complexity.

An exemplary block diagram of a receiver architecture of the prior art is shown in FIG. 1. Within receiver 1100, the transmitted RF signal is received by antenna 1112, routed through duplexer 1114, and provided to low noise amplifier (LNA) 1116. LNA 1116 amplifies the RF signal and provides the signal to bandpass filter 1118. Bandpass filter 1118 filters the signal to remove some of the spurious signals which can cause intermodulation products in the subsequent stages. The filtered signal is provided to mixer 1120 which downconverts the signal to an intermediate frequency (IF) with the sinusoidal from local oscillator 1122. The IF signal is provided to bandpass filter 1124 which filters spurious signals and downconversion products prior to the subsequent downconversion stage. The filtered IF signal is provided to automatic-gain-control (AGC) amplifier 1126 which amplifies the signal with a variable gain to provide an IF signal at the required amplitude. The gain is controlled by a control signal from AGC control circuit 1128. The IF signal is provided to demodulator 1130 which demodulates the signal in accordance with the modulation format used at the transmitter. For digital transmission such as binary phase shift keying (BPSK), quaternary phase shift keying (QPSK), offset quaternary phase shift keying (OQPSK), and quadrature amplitude modulation (QAM), a digital demodulator is used to provide the digitized baseband data. For FM transmission, an FM demodulator is used to provide the analog signal.

Receiver 1100 comprises the basic functionalities required by most receivers. However, the location of amplifiers 1116 and 1126, bandpass filters 1118 and 1124, and mixer 1120 can be rearranged to optimize the receiver performance for a particular application. In this receiver architecture, high IIP3 is provided for by biasing the active devices at high DC bias current and/or by controlling the gain of amplifier 1126.

This receiver architecture has several drawbacks. First, the active devices are typically biased to a high DC current to provide the highest required IIP3. This has the effect of operating receiver 1100 at the high IIP3 operating point at all times, even though high IIP3 is not required most of the time. Second, the high IIP3 can be improved by adjusting the gain of AGC amplifier 1126, as disclosed in the aforementioned U.S. Pat. No. 5,099,204. However, lowering the gain of amplifier 1126 can degrade the noise figure of receiver 1100.

SUMMARY OF THE INVENTION

The present invention is a novel and improved programmable linear receiver which provides the requisite level of system performance with reduced power consumption. In the exemplary embodiment, the receiver comprises an attenuator, at least one stage of fixed gain amplifier, a mixer, and a demodulator. Each amplifier has a bypass signal path comprising a pad and a switch. In the exemplary embodiment, the amplifiers and the mixer comprise active devices whose IIP3 operating point can be individually adjusted with bias control signals. In the exemplary embodiment, the required AGC is provided by the attenuator, the amplifiers and the pads, and the demodulator.

It is an object of the present invention to provide a programmable linear receiver which minimizes power consumption based on the measured non-linearity in the output signal from the receiver. In the exemplary embodiment, the amount of non-linearity is measured by the received signal strength indicator (RSSI) slope method. The RSSI slope is the ratio of the change in the output signal plus intermodulation to the change in the input signal. In the exemplary embodiment, the input signal level is periodically increased by a predetermined level and the output signal from the receiver is measured. The output signal comprises the desired signal and intermodulation products from non-linearity within the receiver. When the receiver is operating linearly, the output signal level increases dB for dB with the input signal level. However, as the receiver transitions into non-linear region, intermodulation products due to non-linearity increase faster than the desired signal. By detecting the RSSI slope, the amount of degradation due to non-linearity can be determined. This information is then used to adjust the IIP3 operating point of the amplifiers and mixer to provide the requisite level of performance while minimizing power consumption. The amount of non-linearity can also be estimated by other measurement techniques, such as energy-per-chip-to-noise-ratio (Ec/Io).

It is another object of the present invention to provide a programmable linear receiver which minimizes power consumption based on the operating mode of the receiver. Each operating mode of the receiver can operate on an input signal having unique characteristics (e.g. CDMA, FM) and each operating mode can have different performance requirements. In the exemplary embodiment, a controller within the receiver has knowledge of the operating mode and the associated settings of the components within the receiver to provide the required performance. For example, CDMA mode requires high IIP3 operating point and the active devices are biased accordingly when the receiver is operating in the CDMA mode. In contrast, FM mode has less stringent linearity requirements and can be biased to a lower IIP3 operating point while the receiver is operating in the FM mode.

It is yet another object of the present invention to provide a programmable linear receiver which minimizes power consumption based on the measured signal level at various stages within the receiver. Power detectors can be connected to the output of selected components to measure the power level of the signal. The power measurements are then used to adjust the IIP3 operating point of any component operating past a predetermined level of non-linearity.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein:

FIGS. 6A–6B are diagrams of the IIP3 performance versus bias current of the transistor used in the LNA and the performance curves of the LNA, respectively;

FIGS. 8A–8B are diagrams of the AGC control range for ascending and descending CDMA input power, respectively;

FIGS. 10A–10B are diagrams of the IIP3 bias control for ascending and descending CDMA input power, respectively.

DETAILED DESCRIPTION OF THE PREFERRED EMBODIMENTS

The receiver of the present invention provides the requisite level of system performance and minimizes power consumption by controlling the DC bias of the active devices. The present invention can be practiced using one of three embodiments described in detail below. In the first embodiment, the amount of non-linearity at the output of the receiver is measured and used to set the IIP3 operating point of the active devices within the receiver, such as the amplifiers and mixer. In the second embodiment, the IIP3 operating point of the active devices are set in accordance with the expected received signal level based on the operating mode of the receiver. And in the third embodiment, the IIP3 operating point of the active devices are set in accordance with the measured signal level at various stages within the receiver.

In the present invention, the AGC function is provided by an AGC control circuit which operates in conjunction with a bias control circuit. The IIP3 operating point of the active devices are set in accordance with the measured amount of non-linearity which is dependent on the amplitude of the signal. The signal amplitude, in turn, depends on the gain settings of the receiver. In the present invention, the AGC and bias control are operated in an integrated manner to provide the required level of linearity over a specified AGC range while minimizing power consumption.

I. Receiver Architecture

Figure 1:
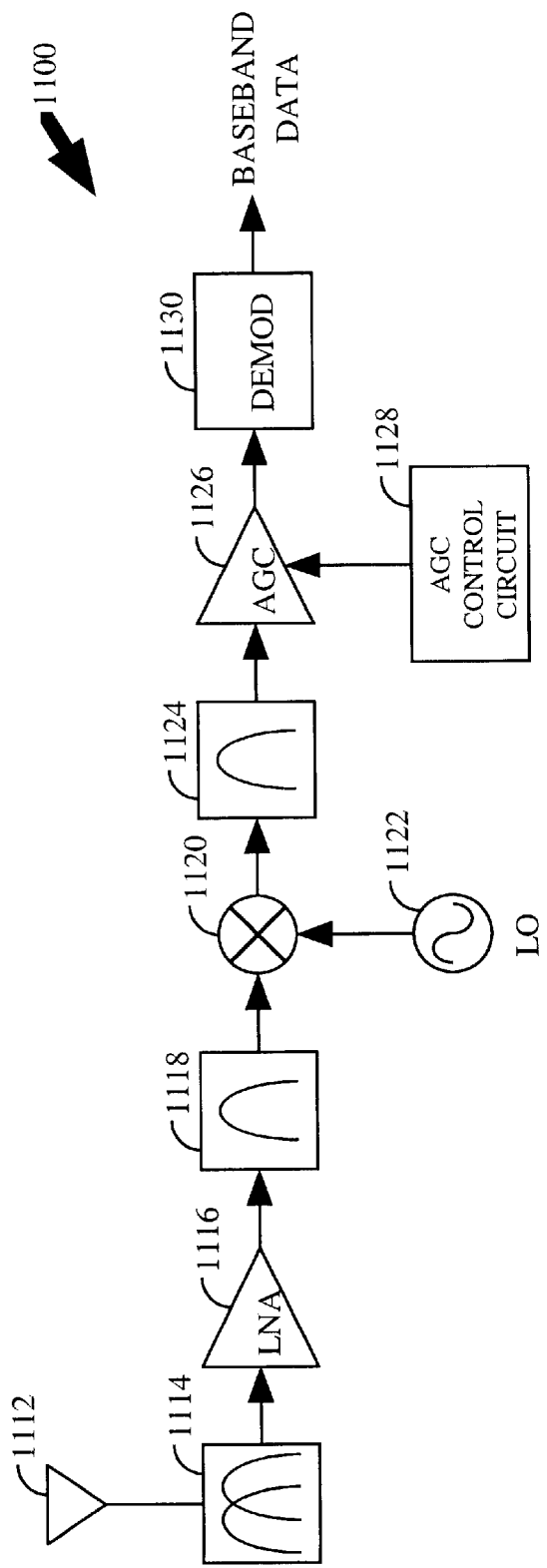
FIG. 1 is a block diagram of an exemplary receiver of the prior art.
Figure 2:
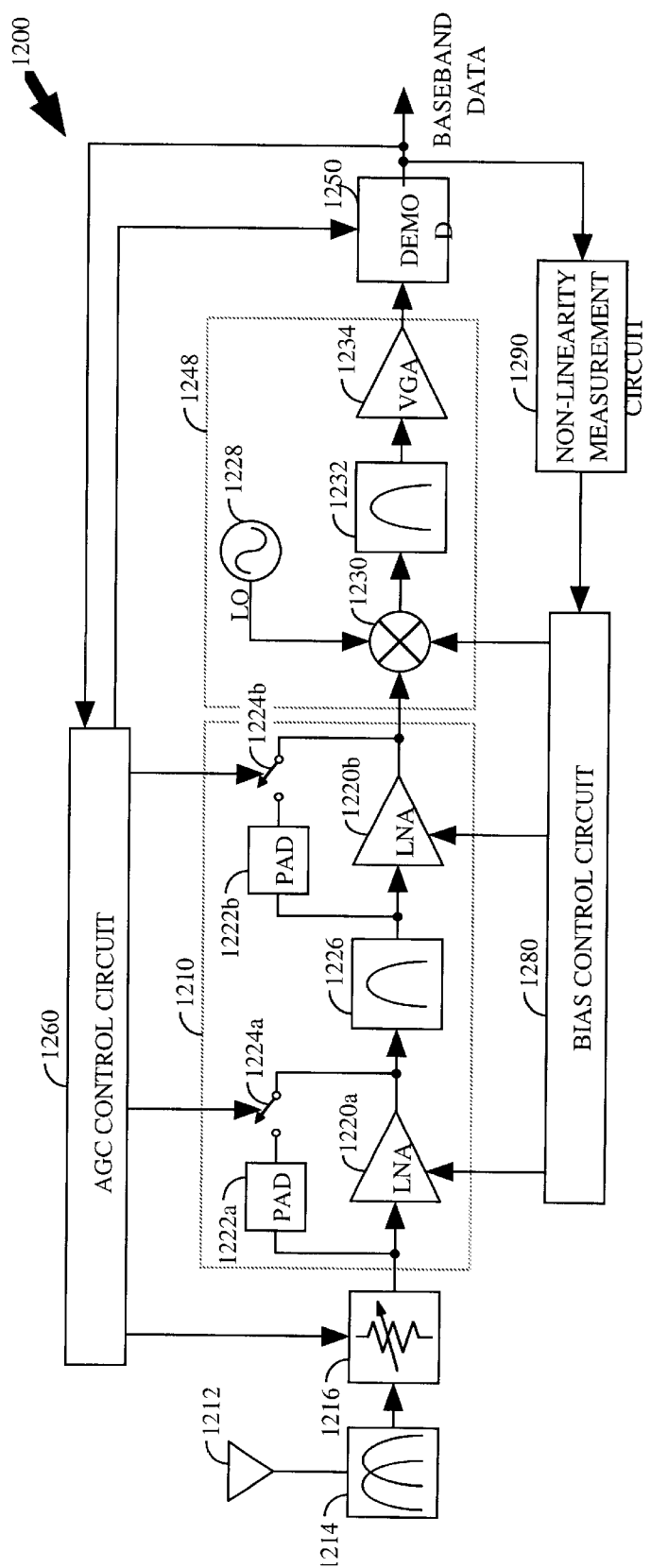
FIG. 2 is a block diagram of an exemplary programmable linear receiver of the present invention.

A block diagram of an exemplary receiver architecture of the present invention is shown in FIG. 2. Within receiver 1200, the transmitted RF signal is received by antenna 1212, routed through duplexer 1214, and provided to attenuator 1216. Attenuator 1216 attenuates the RF signal to provide a signal at the required amplitude and provides the attenuated signal to RF processor 1210. Within RF processor 1210; the attenuated signal is provided to pad 1222a and low noise amplifier (LNA) 1220a. LNA 1220a amplifies the RF signal and provides the amplified signal to bandpass filter 1226. Pad 1222a provides a predetermined level of attenuation and connects in series with switch 1224a. Switch 1224a provides a bypass route around LNA 1220a when the gain of LNA 1220a is not needed. Bandpass filter 1226 filters the signal to remove spurious signals which can cause intermodulation products in the subsequent. signal processing stages. The filtered signal is provided to pad 1222b and low noise amplifier (LNA) 1220b. LNA 1220b amplifies the filtered signal and provides the signal to RF/IF processor 1248. Pad 1222b provides a predetermined level of attenuation and connects in series with switch 1224b. Switch 1224b provides a bypass route around LNA 1220b when the gain of LNA 1220b is not needed. Within RF/IF processor 1248, mixer 1230 downconverts the signal to an intermediate frequency (IF) with the sinusoidal from local oscillator (LO) 1228. The IF signal is provided to bandpass filter 1232 which filters out spurious signals and out-of-band downconversion products. In the preferred embodiment, the filtered IF signal is provided to voltage control amplifier (VGA) 1234 which amplifies the signal with a variable gain which is adjusted by a gain control signal. Amplifier 1234 can also be implemented as a fixed gain amplifier, depending on the system requirement, and this is also within the scope of the present invention. The amplified IF signal is provided to demodulator 1250 which demodulates the signal in accordance with the modulation format used by the transmitter (not shown). RF processor 1210 and RF/IF processor 1248 is collectively referred to as a front end.

Figure 4:
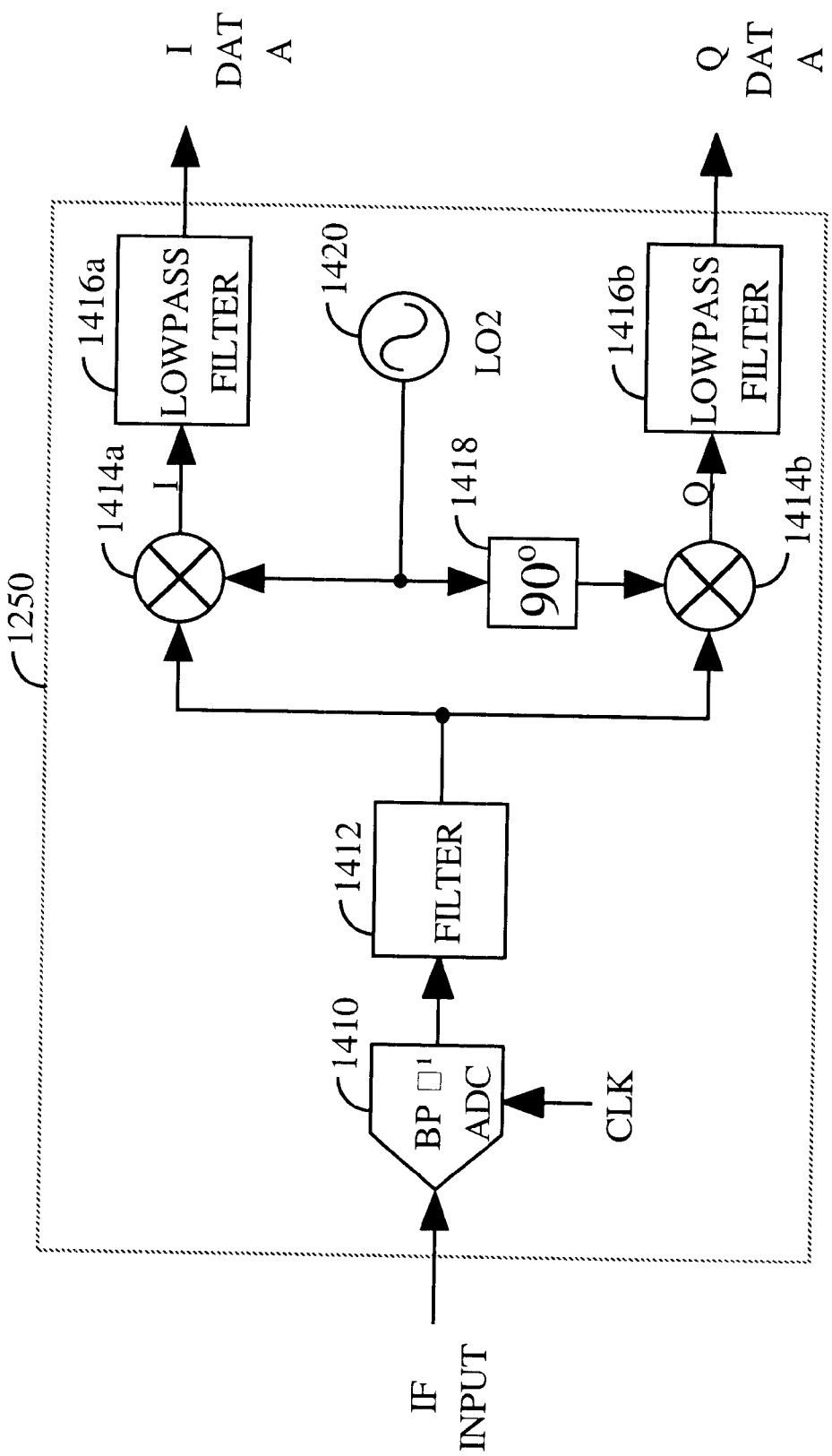
FIG. 4 is a block diagram of an exemplary QPSK demodulator which is used within the receivers of the present invention.

A block diagram of an exemplary demodulator 1250 used for demodulation of quadrature modulated signals (e.g. QPSK, OQPSK, and QAM) is illustrated in FIG. 4. In the exemplary embodiment, demodulator 1250 is implemented as a subsampling bandpass demodulator. The IF signal is provided to bandpass sigma delta analog-to-digital converter (ΣΔ ADC) 1410 which quantizes the signal at a high sampling frequency determined by the CLK signal. An exemplary design of a ΣΔ ADC is described in detail in U.S. Pat. No. 5,982,315 entitled "SIGMA-DELTA ANALOG-TO-DIGITAL CONVERTER", issued Nov. 9, 1999, and assigned to the assignee of the present invention. The use of a ΣΔ ADC within a receiver is disclosed in U.S. Pat. No. 6,005,506, entitled "RECEIVER WITH SIGMA-DELTA ANALOG-TO-DIGITAL CONVERTER", issued Dec. 21, 1999, assigned to the assignee of the present invention and incorporated by reference herein. The quantized signal is provided to filter 1412 which filters and decimates the signal. The filtered signal is provided to multipliers 1414a and 1414b which downconvert the signal to baseband with the in-phase and quadrature sinusoids from local oscillator (LO2) 1420 and phase shifter 1418, respectively. Phase shifter 1418 provides 90° of phase shift for the quadrature sinusoidal. The baseband I and Q signals are provided to lowpass filters 1416a and 1416b, respectively, which filter the signal to provide the I and Q data. The baseband data in FIG. 2 comprises the I and Q data in FIG. 4. In the exemplary embodiment, filter 1412 and/or lowpass filters 1416 also provide scaling of the signal to enable demodulator 1250 to provide baseband data at various amplitudes. Other implementations of demodulator 1250 can be designed to performed the demodulation of QPSK modulated waveform and are within the scope of the present invention.

Referring back to FIG. 2, receiver 1200 comprises the basic functionalities required by most receivers. However, the arrangement of attenuator 1216, LNAs 1220a and 1220b, bandpass filters 1226 and 1232, and mixer 1230 can be reordered to optimize the performance of receiver 1200 for specific applications. For example, attenuator 1216 can be interposed between LNA 1220a and bandpass filter 1226, to improve the noise figure performance. Furthermore, a bandpass filter can be inserted before LNA 1220a to remove undesirable spurious signals before the first amplifier stage. Different arrangements of the functionalities shown herein can be contemplated and are within the scope of the present invention. Furthermore, other arrangements of the functionalities shown herein in combination with other receiver functionalities which are known in the art can also be contemplated and are within the scope of the present invention.

In the present invention, attenuator 1216, switches 1224a and 1224b, and demodulator 1250 are controlled by AGC control circuit 1260 such that the IF signal from amplifier 1234 is at the required amplitude. The AGC function is described in detail below. In the exemplary embodiment, LNAs 1220a and 1220b are fixed gain amplifiers. LNAs 1220a and 1220b and mixer 1230 are controlled by bias control circuit 1280 to adjust the DC bias current and/or voltages of these active devices such that the required linearity performance is achieved with minimal power consumption. The variable IIP3 bias control mechanism is described in detail below.

The receiver architecture of the present invention can be adopted for use in various applications, including cellular telephone and HDTV applications. In the cellular telephone, receiver 1200 can be adopted for use in CDMA communication systems operating at the personal communication system (PCS) band or the cellular band.

Figure 3:
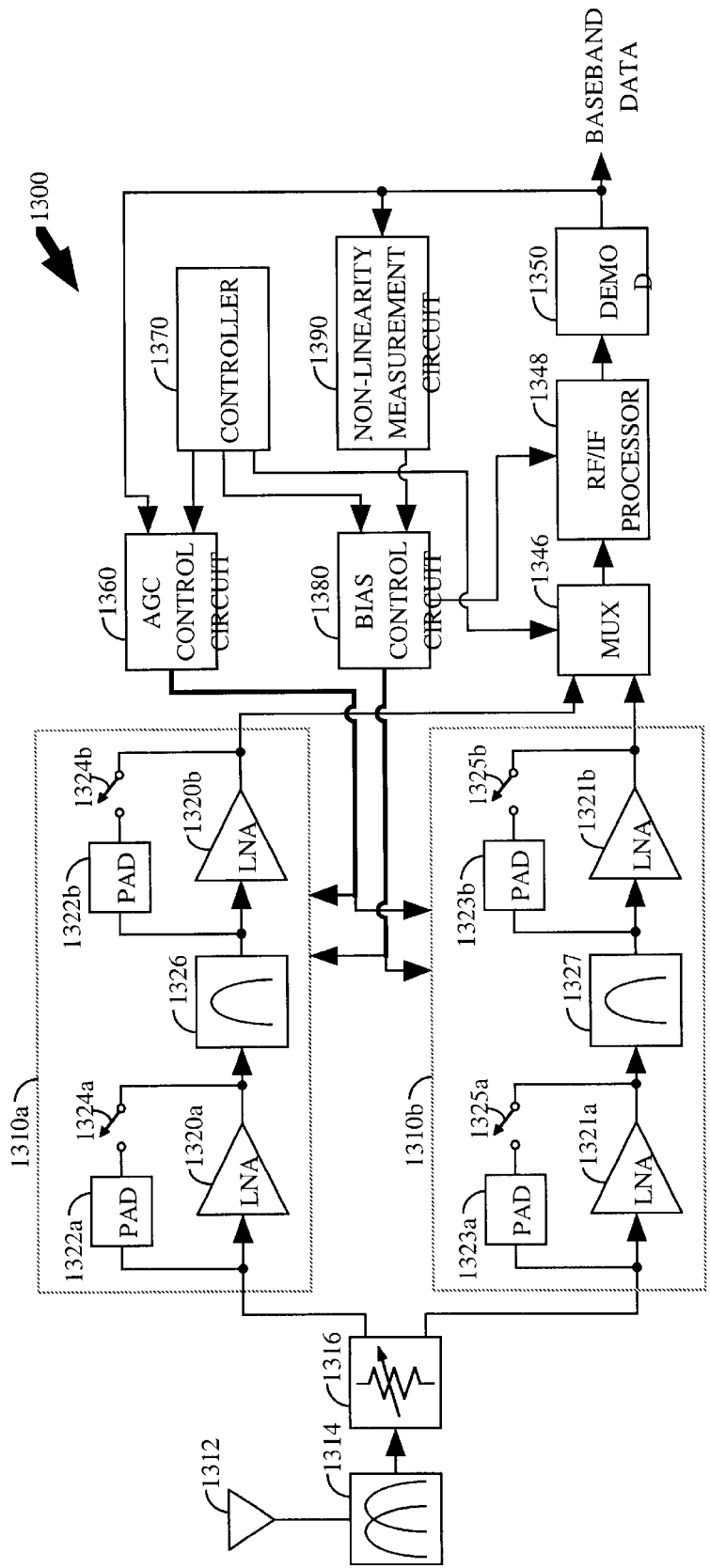
FIG. 3 is a block diagram of an exemplary programmable linear dualband receiver of the present invention.

A block diagram of an exemplary receiver which supports dual-band (PCS and cellular) and dual-mode (CDMA and AMPS) is shown in FIG. 3. The PCS band has a bandwidth of 60 MHz and a center frequency of 1900 MHz. The cellular band has a bandwidth of 25 MHz and a center frequency of 900 MHz. Each band requires a unique RF bandpass filter. Therefore, two RF processors are used for the two bands.

Receiver 1300 comprises many of the same components as those in receiver 1200 (see FIG. 2). Antenna 1312, duplexer 1314, and attenuator 1316 are identical to antenna 1212, duplexer 1214, and attenuator 1216 in receiver 1200. The attenuated signal from attenuator 1316 is provided to RF processors 1310a and 1310b. RF processor 1310a is designed to operate at the cellular band and RF processor 1310b is designed to operate at the PCS band. RF processor 1310a is identical to RF processor 1210 in receiver 1200. RF processor 1310a comprises two stages of low-noise amplifier (LNA) 1320a and 1320b connected in cascade with bandpass filter 1326 interposed between the stages. Each LNA 1320 has a parallel signal path comprising pad 1322 and switch 1324. RF processor 1310b is similar to RF processor 1310a except that LNAs 1321a and 1321b and bandpass filter 1327 are designed to operate at the PCS band. The output from RF processors 1310a and 1310b are provided to multiplexer (MUX) 1346 which selects the desired signal in accordance with a control signal from controller 1370 (not shown in FIG. 3 for simplicity). The RF signal from MUX 1346 is provided to RF/IF processor 1348 which is identical to RF/IF processor 1248, in FIG. 2. The IF signal from processor 1348 is provided to demodulator (DEMOD) 1350 which demodulates the signal in accordance with the modulation format used at the remote transmitter (not shown). Demodulator 1350, AGC control circuit 1360, bias control circuit 1380, and non-linearity measurement circuit 1390 in FIG. 3 are identical to demodulator 1250, AGC control circuit 1260, bias control circuit 1280, and non-linearity measurement circuit 1290 in FIG. 2, respectively.

Controller 1370 connects to AGC control circuit 1360, bias control circuit 1380, and MUX 1346 and controls the operation of these circuits. Controller 1370 can be implemented as a microprocessor, a microcontroller, or a digital signal processor programmed to perform the functions herein described. Controller 1370 can also comprise a memory storage element for storing the operating modes of receiver 1300 and the associated control signals.

Referring to FIG. 2, an exemplary design of receiver 1200 especially adopted for cellular telephone application is given in detail below. In the exemplary embodiment, attenuator 1216 has an attenuation range of 20 dB and provides an attenuation of 0.2 dB to −20 dB. Attenuator 1216 can be designed with a pair of diodes or by field effect transistors (FETs), the implementations of which are known in the art. In the exemplary embodiment, LNAs 1220a and 1220b have fixed gains of 13 dB each. LNAs 1220a and 1220b can be off-the-shelf monolithic RF amplifiers or amplifiers designed using discrete components. An exemplary discrete design of LNA 1220 is given in detail below. In the exemplary embodiment, pads 1222a and 1222b provide 5 dB of attenuation and can be implemented with resistors in the manner known in the art. In the exemplary embodiment, bandpass filter 1226 is a surface acoustic wave (SAW) filter which has a bandwidth of 25 MHz, the entire bandwidth of the cellular band, and is centered about 900 MHz.

In the exemplary embodiment, bandpass filter 1232 is also a SAW filter which has a bandwidth of 1.2288 MHz, the bandwidth of one CDMA system, and is centered about 116.5 MHz. Mixer 1230 is an active mixer which can be an off-the-shelf mixer, such as the Motorola MC13143, or other active mixer which is designed in the manner known in the art. Mixer 1230 can also be implemented with passive components, such as double-balanced diode mixer. Amplifier 1234 can be a monolithic amplifier or an amplifier designed with discrete components. In the exemplary embodiment, amplifier 1234 is designed to provide a gain of 40 dB.

In the exemplary embodiment, the overall gain range of receiver 1200, excluding demodulator 1250, is +51 dB to −5 dB. This gain range presumes exemplary insertion loss of −3 dB for bandpass filter 1226, gain of +1 dB for mixer 1230, and insertion loss of −13 dB for bandpass filter 1232. For CDMA applications, an AGC range of 80 dB is typically required to adequately handle path loss, fading conditions, and jammers. In the exemplary embodiment, the AGC range provided by attenuator 1216, LNAs 1220a and 1220b, and pads 1222a and 1222b is 56 dB. In the exemplary embodiment, the remaining 24 dB of AGC range is provided by demodulator 1250 and/or amplifier 1234. Within demodulator 1250 (see FIG. 4), ADC 1410 quantizes the analog waveform and provides the digitized values to the subsequent digital signal processing blocks. In the exemplary embodiment, the required resolution for ADC 1410 is four bits. In the exemplary embodiment, an additional six bits of resolution provides headroom for the yet unfiltered jammers. ADC 1410 can be designed to provide more than ten bits of resolution. Each additional bit over ten can be used to provide 6 dB of gain control. Fortunately, at high CDMA signal levels, the out-of-band jammer levels cannot continue to be +72 dB above the CDMA signal. Therefore, when the CDMA signal is strong, the jammers require less than 6 bits of resolution for jammer headroom. In the exemplary embodiment, the AGC function performed in demodulator 1250 is active only when the CDMA signal is strong, e.g., at the high end of the CDMA control range. Thus, the extra bits of resolution which are initially reserved for jammer headroom are now used for the AGC function as the result of the strong CDMA signal levels. The design of a subsampling bandpass ΣΔ ADC which provides the performance required for receiver 1200 is disclosed in the aforementioned U.S. Pat. No. 6,005,506.

II. Amplifier Design

Figures 5A, 5B:
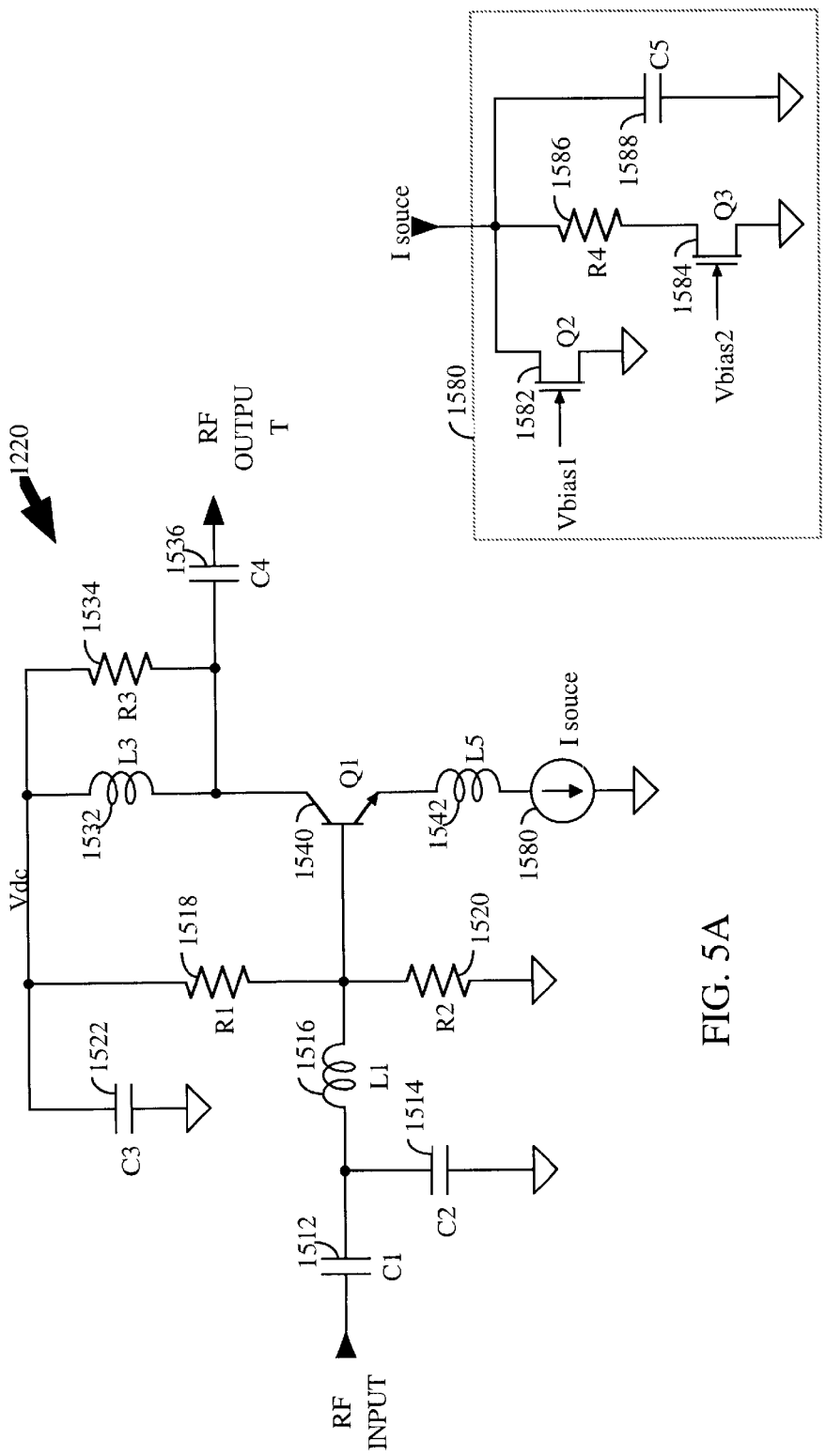
FIGS. 5A–5B are schematic diagrams of an exemplary discrete design of low-noise-amplifier (LNA) and current source which are used in the receivers of the present invention, respectively.

A schematic diagram of an exemplary discrete LNA design is shown in FIG. 5A. Within LNA 1220, the RF input is provided to one end of AC coupling capacitor 1512. The other end of capacitor 1512 connects to one end of capacitor 1514 and inductor 1516. The other end of capacitor 1514 connects to analog ground and the other end of inductor 1516 connects to one end of resistors 1518 and 1520 and the base of transistor 1540. The other end of resistor 1518 connects to the power supply Vdc and the other end of resistor 1520 connects to analog ground. Bypass capacitor 1522 connects to Vdc and analog ground. In the exemplary embodiment, transistor 1540 is a low noise RF transistor, such as the Siemens BFP420, which is commonly used in the art. The emitter of transistor 1540 connects to one end of inductor 1542. The other end of inductor 1542 connects to current source 1580 which also connects to analog ground. The collector of transistor 1540 connects to one end of inductor 1532, resistor 1534, and capacitor 1536. The other end of inductor 1532 and resistor 1534 connect to Vdc. The other end of capacitor 1536 comprises the RF output.

Within LNA 1220, capacitors 1512 and 1536 provide AC coupling of the RF input and output signals, respectively. Capacitor 1514 and inductor 1516 provide noise matching. Inductors 1516 and 1532 also provide matching of the LNA input and output, respectively. Inductor 1532 also provides a DC path for the bias current of transistor 1540. Inductor 1542 provides degeneration of the emitter impedance to improve linearity. Resistors 1518 and 1520 set the DC bias voltage at the base of transistor 1540. Resistor 1534 determines the gain of LNA 1220 and the output impedance. Current source 1580 controls the bias current of transistor 1540 which determines the IIP3 of LNA 1220.

A schematic diagram of an exemplary current source 1580 is shown in FIG. 5B. The sources of n-channel MOSFETs 1582 and 1584 are connected to analog ground. The drain of MOSFET 1584 is connected to one end of resistor 1586. The other end of resistor 1586 connects to the drain of MOSFET 1582 and comprises the output of current source 1580. Bypass capacitor 1588 connects across the output of current source 1580 and analog ground. The gate of MOSFET 1582 is connected to Vbias1 and the gate of MOSFET 1584 is connected to Vbias2.

MOSFETs 1582 and 1584 provide the collector bias current Icc for transistor 1540 which, in turn, determines the IIP3 operating point of LNA 1220. The gates of MOSFETs 1582 and 1584 are connected to a control voltages Vbias1 and Vbias2, respectively. When Vbias1 is low (e.g. 0V), MOSFET 1582 is turned OFF and provides no collector bias current Icc for transistor 1540. When Vbias1 is high (e.g. approaching Vdc), MOSFET 1582 is turned ON and provides the maximum collector bias current for transistor 1540. Thus, Vbias1 determines the amount of collector bias current Icc provided by MOSFET 1582. Similarly, Vbias2 determines the amount of collector bias current provided by MOSFET 1584. However, the voltage at the base of transistor 1540 and the value of resistor 1586 limit the maximum collector bias current provided by MOSFET 1584.

The IIP3 performance of LNA 1220 versus collector bias current Icc is illustrated in FIG. 6A. Notice that the IIP3 increases approximately 6 dB per octave increase (or doubling) in collector bias current. The collector bias current of transistor 1540, the gain of LNA 1220, and the IIP3 of LNA 1220 versus the control voltage Vbias1 are illustrated in FIG. 6B. Notice that the gain is approximately constant (e.g. gain variation of approximately 1 dB for all Vbias1 voltages). Also, note that the IIP3 varies in similar manner with the collector bias current Icc. Thus, the collector bias current can be decreased, if high IIP3 is not required, with minimal effect on the gain of LNA 1220.

FIGS. 5A and 5B illustrate an exemplary design of LNA 1220 and current source 1580, respectively. LNA 1220 can be designed using other topologies to provide the necessary performance (e.g. higher gain, improved noise figure, better matching). LNA 1220 can be designed with other active devices, such as bipolar-junction transistors (BJT), heterojunction-bipolar transistors (HBT), metal-oxide-semiconductor field effect transistor (MOSFET), gallium arsenide field effect transistor (GaAsFET), or other active devices. LNA 1220 can also be implemented as monolithic amplifier in the manner known in the art. Similarly, current source 1580 can be designed and implemented in other manners known in the art. The various implementations of LNA 1220 and current source 1580 are within the scope of the present invention.

III. Variable IIP3 Bias Control

As described above, in-band intermodulation products can be created by spurious signals passing through non-linear devices. One application which has a demanding linearity requirement is a CDMA communication system which is co-located with other cellular telephone systems, such as the Advance Mobile Phone System (AMPS). The other cellular telephone systems can transmit spurious signals (or jammers) at high power near the operating band of the CDMA system, thereby necessitating high IIP3 requirement on the CDMA receiver.

Figure 7A:
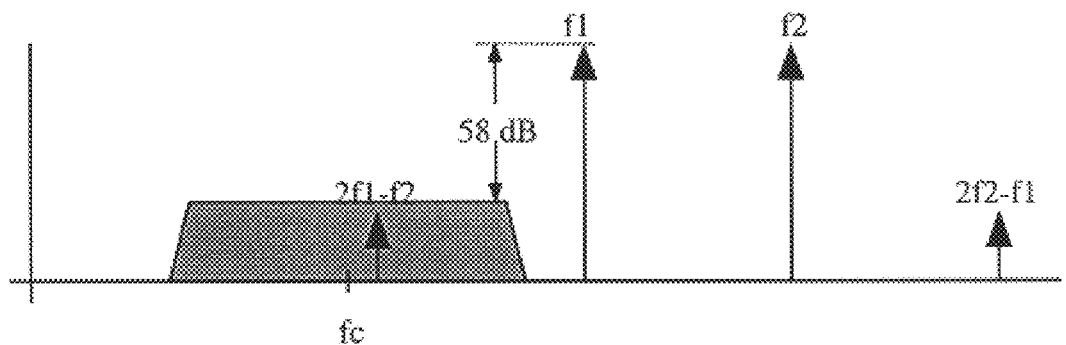
FIGS. 7A–7B are diagrams of the two-tone and single-tone jammers specifications for CDMA signal as defined by IS-98-A, respectively.

The spurious signal rejection requirement for a CDMA system is defined by two specifications, a two-tone test and a single-tone test, in the "TIA/EIA/IS-98-A Intermodulation Spurious Response Attenuation", hereinafter the IS-98-A standard. The two-tone test is illustrated in FIG. 7A. The two tones are located at $f_1$=+900 KHz and $f_2$=+1700 KHz from the center frequency of the CDMA waveform. The two tones are equal in amplitude and 58 dB higher than the amplitude of the CDMA signal. This test simulates an FM-modulated signal being transmitted on the adjacent channel, such as the signal from an AMPS system. The FM-modulated signal contains the bulk of the power in the carrier whereas the power in the CDMA waveform is spread across the 1.2288 MHz bandwidth. The CDMA signal is more immune to channel condition and is maintained at a low power level by a power control loop. In fact, the CDMA signal is maintained at the minimal power level necessary for a requisite level of performance to reduce interference and increase capacity.

Figure 7B:
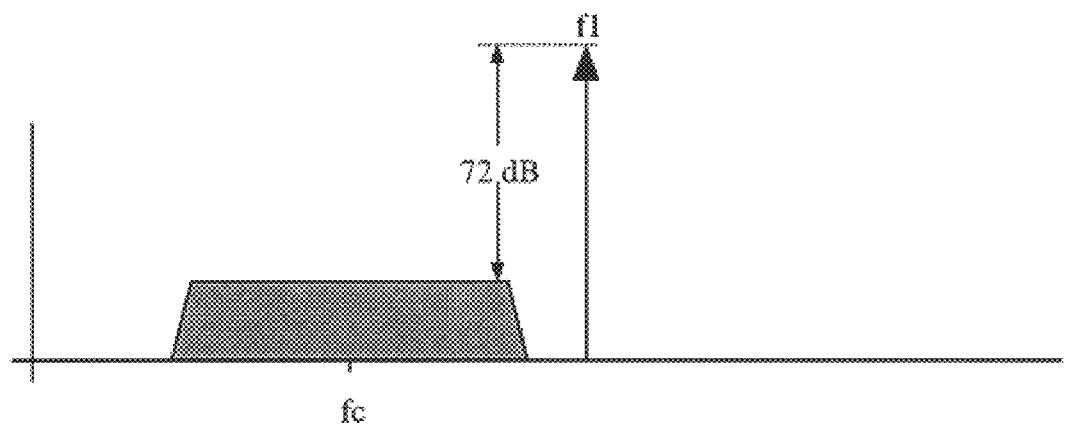

The single-tone test is illustrated in FIG. 7B. The single tone is located at $f_1$=+900 KHz from the center frequency of the CDMA waveform and has an amplitude of +72 dBc higher than the amplitude of the CDMA signal.

In accordance with IS-98-A, the linearity of the receiver is specified at the CDMA input power level of −101 dBm, −90 dBm, and −79 dBm. For the two-tone test, the jammers are at −43 dBm, −32 dBm, and −21 dBm (+58 dBc), and the in-band equivalent signal of the intermodulation products are at −104 dBm, −93 dBm, and −82 dBm, for the input power level of −101 dBm, −90 dBm, and −79 dBm, respectively.

As illustrated in FIG. 7A, the spurious tones (or jammers) at $f_1$=+900 KHz and $f_2$=+1700 KHz produce third order intermodulation products at $(2f_1-f_2)$=+100 KHz and $(2f_2-f_1)$=+2500 KHz. The product at +2500 KHz can be easily filtered by the subsequent bandpass filters 1226 and 1232 (see FIG. 2). However, the product at +100 KHz falls within the CDMA waveform and degrades the CDMA signal.

To minimized degradation in the performance of receiver 1200, the IIP3 of the active devices within receiver 1200 is adjusted in accordance with the amount of non-linearity in the received signal. Receiver 1200 is designed to meet the two-tone intermodulation specification. However, in practice, the jammers are present for only a fraction of the operating time of receiver 1200. Furthermore, the amplitude of the jammers will rarely reach the +58 dB level as specified. Therefore, to design for the worse case jammers and to operate receiver 1200 in the high IIP3 mode in anticipation of the worse case jammers is a waste of battery power.

In the present invention, the IIP3 of the active devices, in particular LNA 1220b and mixer 1230, are adjusted in accordance with the measured non-linearity in the output signal from receiver 1200. In the exemplary embodiment, the non-linearity is measured by the RSSI slope method. The measurement of the RSSI slope is described in detail in U.S. Pat. No. 5,107,225, entitled "HIGH DYNAMIC RANGE CLOSED LOOP AUTOMATIC GAIN CONTROL CIRCUIT", issued Apr. 21, 1992, assigned to the assignee of the present invention and incorporated by reference herein. Referring to FIG. 2, bandpass filter 1232 has a bandwidth of 1.2288 MHz and suppresses most of the jammers and out-of-band intermodulation products. Intermodulation products which fall in-band cannot be suppressed and add to the CDMA waveform. The IF signal from amplifier 1234 is provided to demodulator 1250 which processes the IF signal and provides the digitized baseband data which comprises the I and Q data. The baseband data is provided to non-linearity measurement circuit 1290. In the exemplary embodiment, non-linearity measurement circuit 1290 computes the power of the signal in accordance with the following equation:

$$P=(I^2+Q^2),\qquad(5)$$

where P is the power of the baseband signals, and I and Q are the amplitude of the I and Q signals, respectively. The power measurement is provided to bias control circuit 1280.

The power measurement contains the power of the desired baseband I and Q signals as well as the power of the intermodulation products. As described above, for second order non-linearity, the intermodulation products increase two dB for each dB increase in the input signal level. For third order non-linearity, the intermodulation products increase three dB for each dB increase in the input signal level. Thus, the amount of intermodulation can be estimated by measurement of the RSSI slope which is defined as the change in the output signal level versus the change in the input signal level. The change in the input signal level can be set at a predetermined increment (e.g. 0.5 dB). For receiver 1200 operating in the linear range, 0.5 dB increase in the input signal level corresponds to 0.5 dB increase in the output signal level and an RSSI slope of 1.0. However, as one or more active devices transitions into the non-linear operating region, the RSSI slope increases. A higher RSSI slope corresponds to greater level of non-linearity. An RSSI slope of 3.0 corresponds to receiver 1200 operating in total compression (e.g. no increase in the desired output signal level as the input is increased) and the output being dominated by third order intermodulation products.

In the present invention, the RSSI slope can be compared against a predetermined RSSI threshold. If the RSSI slope exceeds the threshold, the IIP3 of the proper active device is increased. Alternatively, if the RSSI slope is below the RSSI threshold, the IIP3 is decreased. The RSSI threshold can be adjusted during operation of receiver 1200 based on the required bit-error-rate (BER) or frame-error-rate (FER) performance. A higher RSSI threshold allows for higher level of intermodulation products before increasing the IIP3, thereby minimizing power consumption at the expense of BER or FER performance. The RSSI threshold can also be adjusted by a control loop which sets the threshold for a required level of performance (e.g. 1% FER). In the exemplary embodiment, the RSSI slope is selected to be 1.2. However, the use of other RSSI thresholds are within the scope of the present invention.

In the present invention, it is not critical to measure the amplitude of the jammers directly. It is more important to measure the undesirable effect of the jammers, in terms of higher level of intermodulation products, on the desired signal. The RSSI slope is one method for measuring the level of non-linearity. The level of non-linearity can also be measured by calculating the change in the energy-per-chip-to-noise-ratio (Ec/Io) of the output signal for an incremental change in the amplitude of the input signal. The intermodulation products increase by a factor of three to one when receiver 1200 is in compression and the output signal is dominated by third order intermodulation products. As with the RSSI slope method, the level of non-linearity can be estimated by the change in Ec/Io versus the change in the input signal level. Other methods to measure the level of non-linearity can be contemplated and are within the scope of the present invention.

In the exemplary embodiment, to maximize performance, the IIP3 of the active devices are adjusted in a accordance with the amount of non-linearity (e.g. through measurement of the RSSI slope) experienced by each active device. LNAs 1220a and 1220b provide a fixed gain. Thus, mixer 1230 experiences the largest signal level, LNA 1220b experiences the next largest signal level, and LNA 1220a experiences the smallest signal level (this presumes that the gain of LNA 1220a is larger than the insertion loss of bandpass filter 1226). With these assumptions, the IIP3 operating point of mixer 1230 is increased first if a jammer is detected (e.g. through high RSSI slope measurement). Once the IIP3 of mixer 1230 is fully adjusted (e.g. to the highest IIP3 operating point), the IIP3 of LNA 1220b is increased. Finally, once the IIP3 of LNA 1220b is fully adjusted, the IIP3 of LNA 1220a can be increased. In the exemplary embodiment, LNA 1220a is maintained at a predetermined IIP3 operating point to optimize the performance of receiver 1200. In the complementary manner, the IIP3 of LNA 1220b is decreased first if no jammer is detected. Once the IIP3 of LNA 1220b is fully adjusted (e.g. to the lowest IIP3 operating point), the IIP3 of mixer 1230 is decreased.

The IIP3 of LNA 1220b and mixer 1230 can be adjusted in continuous manner (e.g. by providing for continuous Vbias1 and Vbias2 control voltages) or in discrete steps. The present invention is directed to the use of continuous, discrete steps, or other methods for controlling the IIP3 of the active devices.

The above described order of IIP3 adjustment presumes that IIP3 is the only consideration. However, different applications may experience different input conditions and have different performance requirements. The order of IIP3 adjustment can be rearranged to meet these requirements. Furthermore, the IIP3 adjustment can be reversed in direction from that described above (e.g. decreasing IIP3 for increasing input signal level) to optimize the performance of receiver 1200 for a particular operating condition. Different order of IIP3 adjustment and different direction of IIP3 adjustment are within the scope of the present invention.

IV. Gain Control

Most receivers are designed to accommodate a wide range of input signal levels. For CDMA receivers, the required AGC range is nominally 80 dB. In the exemplary embodiment of the present invention (see FIG. 2), the AGC range is provided by attenuator 1216, LNAs 1220a and 1220b, pads 1222a and 1222b, demodulator 1250, and possibly amplifier 1234. In the exemplary embodiment, attenuator 1216 provides an AGC range of 20 dB, pad 1222a and 1222b each provide an AGC range of 5 dB, LNA 1220a and 1220b each provide an AGC range of 13 dB, and amplifier 1234 and/or demodulator 1250 provides an AGC range of 24 dB. The AGC range of one or more of these components can be adjusted and are within the scope of the present invention. Furthermore, amplifier 1234 can be designed to provide an AGC range to supplements those of other components. For example, the AGC range of pads 1222 can be reduced to 2 dB each and amplifier 1234 can be designed with 6 dB of AGC range.

In the exemplary embodiment, the first 2 dB of AGC range is provided by demodulator 1250. Demodulator 1250 comprises bandpass subsampling ΣΔ ADC 1410 which provides additional bits of resolution which can be used for AGC control. The next 20 dB of AGC range is provided by attenuator 1216 and/or amplifier 1234. The next 18 dB of AGC range is provided by LNAs 1220a and pad 1222a. The next 18 dB of AGC range is provided by LNAs 1220b and pad 1222b. And the remaining 22 dB of AGC range is provided by amplifier 1234 and/or demodulator 1250.

An exemplary diagram illustrating the AGC control operation of receiver 1200 of the present invention for ascending CDMA input signal power is illustrated in FIG. 8A. In this example, amplifier 1234 is implemented as a fixed gain amplifier for simplicity. The CDMA input power level can range from −104 dBm to −24 dBm. From −104 dBm to −102 dBm, LNAs 1220a and 1220b are turned ON, switches 1224a and 1224b are switched OFF, and the AGC is provided by demodulator 1250. From −102 dBm to −85 dBm the AGC is provided by attenuator 1216. From −84 dBm to −62 dBm, LNA 1220a is turned OFF, switch 1224a is switched ON, LNA 1220b remains ON, switch 1224b remains OFF, and the AGC is provided by attenuator 1216. From −63 dBm to −46 dBm, LNAs 1220a and 1220b are turned OFF, switches 1224a and 1224b are switched ON, and the AGC is provided by attenuator 1216. Finally, above −46 dBm, attenuator 1216 is fully attenuated, the IF signal level into demodulator 1250 increases dB per dB with the input RF signal level, and the AGC is provided after ADC 1410 by demodulator 1250.

An exemplary diagram illustrating the AGC control operation of receiver 1200 for descending CDMA signal power is illustrated in FIG. 8B. Again, amplifier 1234 is implemented as a fixed gain amplifier in this example for simplicity. From −24 dBm to −46 dBm, LNAs 1220a and 1220b are turned OFF, switches 1224a and 1224b are switched ON, and the AGC is provided after ADC 1410 by demodulator 1250. From −46 dBm to −66 dBm, the AGC is provided by attenuator 1216. From −66 dBm and −69 dBm, attenuator 1216 is at the minimum attenuation state and the AGC is provided by demodulator 1250. At −70 dBm, LNA 1220b is turned ON and switch 1224b is switched OFF. From −70 dBm to −84 dBm, the AGC is provided by attenuator 1216. From −84 dBm to −90 dBm, the AGC is provided by demodulator 1250. At −91 dBm, LNA 1220a is turned ON and switch 1224a is switched OFF. From −91 dBm to −102 dBm, the AGC is provided by attenuator 1216. And from −102 dBm to −104 dBm, the AGC is provided by demodulator 1250.

FIGS. 8A–8B illustrate the input RF signal levels where LNAs 1220a and 1220b are turned ON and OFF. LNA 1220a is turned OFF as the input signal level exceeds −85 dBm (see FIG. 8A) but is not turned ON again until the signal level decreases past −91 dBm. The −6 dB of hysteresis prevents LNA 1220a from toggling between the ON and OFF states. LNA 1220b also is provided with 6 dB of hysteresis for the same reason. Different amounts of hysteresis can be used to optimize system performance and are within the scope of the present invention.

The discussion above illustrates an exemplary implementation of the required AGC control. The AGC control can also be implemented with AGC amplifiers having adjustable gains. Furthermore, the arrangement of attenuator 1216 and LNAs 1220a and 1220b as illustrated in FIG. 2 is just one implementation which satisfies the CDMA specification. Other implementations of the AGC functionalities using the elements described herein, and other implementations using these elements in combination with other elements or circuits which are known in the art, are within the scope of the present invention.

V. Receiver Setting According to Measured Non-Linearity

Figure 9:
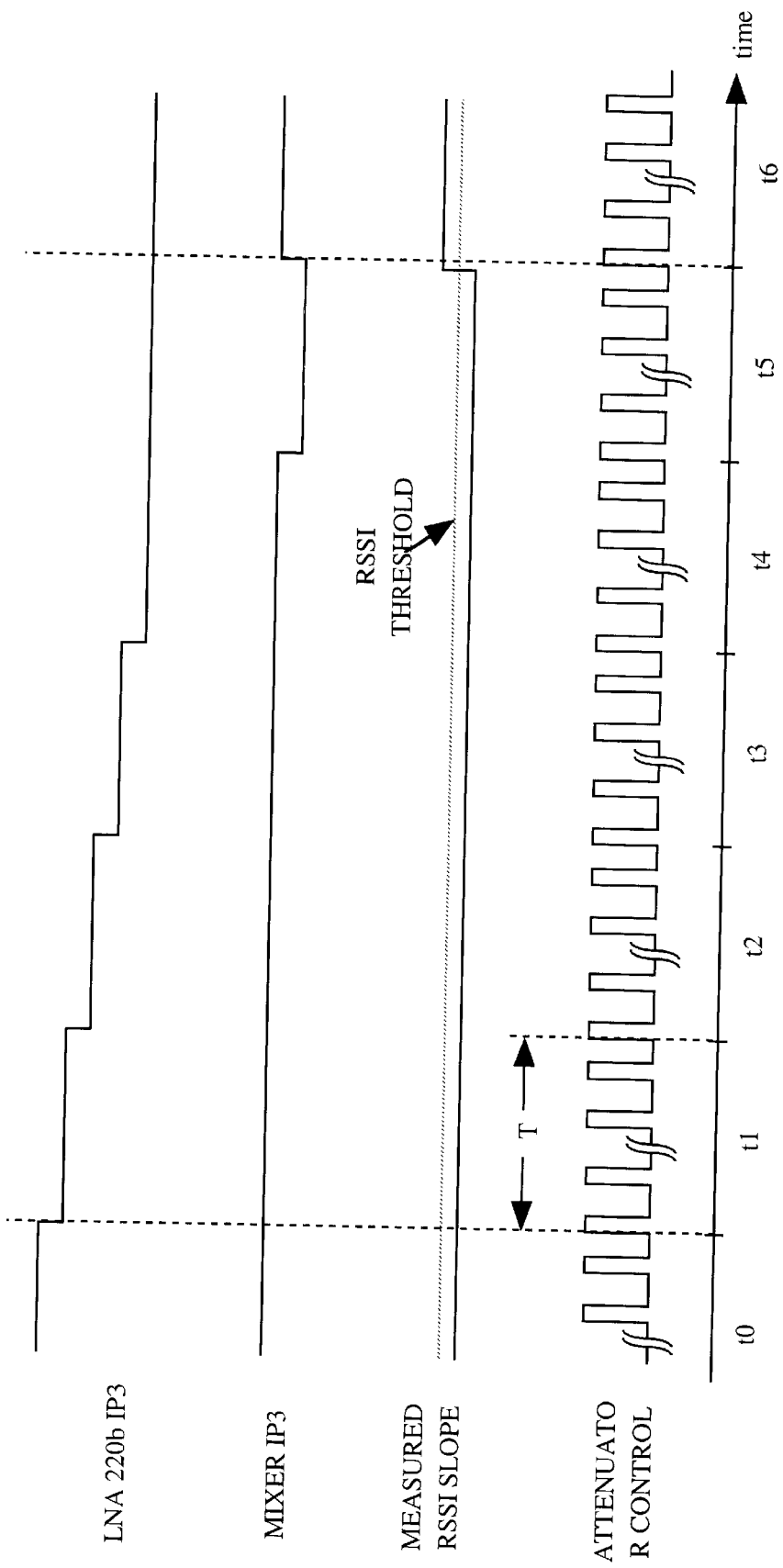
FIG. 9 is a diagram of an exemplary IIP3 bias control mechanism of the present invention.

In the first embodiment of the present invention, the IIP3 of the active devices are set in accordance with the measured level of non-linearity produced by receiver 1200. The level of non-linearity can be estimated by the RSSI slope or by Ec/Io measurement. The timing diagram of an exemplary RSSI slope measurement implementation. is illustrated in FIG. 9. In the exemplary embodiment, the input RF signal level is changed by varying the attenuation of attenuator 1216 in narrow pulses. Each pulse is referred to as a "wiggle". The RSSI slope is measured for each pulse and the measurements are averaged over a predetermined period T to improve the accuracy of the RSSI slope measurement. At the end of the period T, the measured RSSI slope is compared to the RSSI threshold and the result is used to adjust the IIP3 of the active devices, in the manner described above.

As shown in FIG. 9, the RSSI slope measurement at $T_0$ is less than the RSSI threshold, indicating that receiver 1200 is operating within the linear limit. Thus, the IIP3 of LNA 1220b is decreased to conserve power consumption. Similarly, at the end of periods $T_1$, $T_2$, and $T_3$, the measured RSSI slope is less than the RSSI threshold and the IIP3 of LNA 1220b continues to be decreased. At the end of period $T_4$, the measured RSSI slope is still less than the RSSI threshold and the IIP3 of mixer 1230 is decreased since the IIP3 of LNA 1220b has been adjusted fully to the minimal IIP3 operating point. At the end of period $T_5$, the measured RSSI slope is greater than the RSSI threshold, indicating that the intermodulation products has increased to an unacceptable level. The IIP3 of mixer 1230 is increased to improve linearity in response thereto.

In the exemplary embodiment, each pulse is 200 μsec in duration, the period T is 5 msec, and the number of pulses within one period T is nine. Using these values, the duty cycle is 36 percent. In the preferred embodiment, the duty cycle of the pulses should be low enough so that the Ec/Io of the desired signal is minimally degraded by the periodic perturbation in the signal amplitude. The width of the pulses is selected to be short in duration to minimize disturbance to AGC control circuit 1280. Typically, the AGC control loop is slow and cannot track the changes in signal level caused by the short attenuation pulses. This is particularly important since the change in the amplitude of the output signal should accurately reflect the changes in the amplitude of the input signal and the intermodulation products, and not the changes caused by AGC control circuit 1280. However, short pulse width results in less accurate measurement of the output signal power. The present invention is directed at the use of pulses of various widths and various duty cycles for the functions described herein.

The amplitude of the perturbation in the input RF signal level is selected to be small to minimize degradation in the output signal and to minimize effect on the IIP3 of the entire receiver 1200. In the exemplary embodiment, the attenuation step for RSSI slope measurement is 0.5 dB. Other values for the attenuation step can be used and are within the scope of the present invention.

In the exemplary embodiment, the RSSI threshold is selected to be 1.2. The use of one RSSI threshold can result in toggling the IIP3 operating points between successive periods T. To prevent this, two RSSI thresholds can be used to provide hysteresis. The IIP3 is not increased unless the measured RSSI slope exceeds the first RSSI threshold and the IIP3 is not decreased unless the measured RSSI slope is below the second RSSI threshold. The use of a single threshold or multiple thresholds are within the scope of the present invention.

A diagram illustrating the IIP3 bias control operation of receiver 1200 of the present invention for ascending input RF power level is shown in FIG. 10A. The input RF signal comprises a CDMA signal and two-tone jammers which are +58 dBc above the CDMA signal. When the CDMA signal power is between −104 dBm and −101 dBm, the IIP3 of mixer 1230 is set at +10 dBm and the IIP3 of LNAs 1220a and 1220b are set at 0 dBm. As the CDMA signal increases past −101 dBm, the measured RSSI slope exceeds the RSSI threshold, and the IIP3 of mixer 1230 is increased to +15 dBm to minimize the level of non-linearity. Attenuator 1216 provides attenuation of the input RF signal between −104 dBm and −84 dBm. At −84 dBm, LNA 1220a is bypassed and attenuator 1216 resets to its low attenuation state. When the CDMA signal power is at −83 dBm, −79 dBm, −75 dBm, and −71 dBm, the IIP3 of LNA 1220b is increased to minimize intermodulation products. At approximately −64 dBm, LNA 1220b is bypassed and attenuator 1216 again resets to its low attenuation state.

A diagram illustrating the IIP3 bias control operation of receiver 1200 for descending input RF power level is shown in FIG. 10B. Again, the input RF signal comprises a CDMA signal and two-tone jammers which are +58 dBc above the CDMA signal. Initially, when the CDMA input signal power is at −60 dBm, LNAs 1220a and 1220b are bypassed. When the CDMA signal power decreases to −70 dBm, LNA 1220b is turned ON to provide the necessary gain. At approximately −76 dBm, −80 dBm, −84 dBm, and −88 dBm, the IIP3 of LNA 1220b is decreased to minimize power consumption. At −90 dBm, attenuator 1216 reaches its upper attenuation range and LNA 1220a is turned ON. At −100 dBm, the IIP3 of mixer 1230 is decreased to conserve power since the input RF signal level is small.

As discussed above, the input RF power level where the IIP3 of mixer 1230 and LNAs 1220a and 1220b are adjusted are determined by the measured RSSI slope. The RSSI slope measurement may not result in linearly spaced IIP3 bias switch points as: shown in FIGS. 10A and 10B. Furthermore, the stepwise switch points can be replaced with continuously adjustable bias control.

VI. Receiver Setting According to Operating Mode

In the second embodiment of the present invention, the IIP3 of the active devices are set in accordance with the operating mode of the receiver. As stated above, receiver 1300 (see FIG. 3) can be used in a cellular telephone which is required to operate in either PCS or cellular band. Each band can support either digital and/or analog platforms. Each platform can further comprise a variety of operating modes. The various operating modes are utilized to improve performance and conserve battery power. For example, different operating modes are used to support the following features of a cellular telephone: (1) slotted mode paging for longer stand-by time, (2) gain step for dynamic range enhancement, (3) punctured transmitter output for longer talk time, (4) frequency band selection for dual-band phones (PCS and cellular), (5) multiple access toggling between systems (CDMA, AMPS, GSM, etc.), and (6) means for circuit bias control in the presence of jammers.

The operating modes of the cellular telephone can have different performance requirements. In the exemplary embodiment, each operating mode is assigned a unique identifier comprising N mode bits. The mode bits define particular characteristics of the operating mode. For example, one mode bit can be used to select between the PCS and cellular band and another mode bit can be used to select between digital (CDMA) or analog (FM) mode. The N mode bits are provided to a logic circuitry within controller 1370 which decodes the N mode bits into a control bus comprising up to $2^N$ control bits. The control bus is routed to circuits within receiver 1300 which require control. For example, the control bus can direct the following: (1) set the IIP3 of the mixer within RF/IF processor 1348 and the LNAs within RF processors 1310a and 1310b, (2)

set the gain of receiver 1300, (3) set the DC bias voltages and/or current to other RF and IF circuitry within receiver 1300, (4) select the desired signal band, and (5) set the oscillators to the proper frequencies.

An exemplary implementation of the IIP3 control for receiver 1300 based on operating mode is illustrated in Tables 1 and 2. Receiver 1300 supports dual-band (PCS and cellular) and dual-mode (CDMA and FM). In the exemplary embodiment, the PCS band only supports CDMA transmission whereas the cellular band supports both CDMA and FM transmissions (the FM transmission can be from the AMPS system). In the exemplary embodiment, four mode bits are utilized. The four mode bits are the BAND_SELECT, IDLE/, FM/, and LNA_RANGE bits. The BAND_SELECT bit determines the band of operation and is defined as 1=PCS and 0=cellular. The IDLE/ bit (0=idle) sets receiver 1300 into idle (e.g. operating at lower IIP3) while the cellular telephone is inactive. The FM/ bit (0=FM) sets receiver 1300 to process FM signal. And the LNA_RANGE bit (1=bypass) sets the gain of receiver 1300. When the LNA_RANGE bit is set high, designating the bypass mode, Vbias1 and Vbias2 of the first LNA 1320a or 1321a are set low, and the LNA is turned OFF.

When BAND_SELECT is set to 0 (cellular band), receiver 1300 operates in one of the cellular operating modes listed in Table 1. Table 1 lists the IIP3 operating point of LNAs 1320a and 1320b. A similar table e generated for the IIP3 operating point of the active mixer within processor 1348. While in the cellular mode, the DC bias current for 1321a and 1321b are turned OFF to conserve battery power.

Tables 1 and 2 list the IIP3 operating, points of the LNAs to minimize power consumption while maintaining the require performance. Additional tables can be generated for other circuits which require control. For example, a table can be generated which sets the AGC to the proper operating range based on the expected input signal level for the desired operating mode. Other tables can be generated to set the DC bias voltages or current which are required by various circuits within receiver 1300.

VII. Receiver Setting According to Received Signal Level

In the third embodiment of the present invention, the IIP3 of the devices are set in accordance with the measured amplitude of the at various signal processing stages within the receiver. Referring to FIG. 2, power detectors can be connected to the output of selected components to measure the power level of the signal. In the first embodiment of this receiver setting scheme, power detectors can be connected to the output of LNA 1220a and 1220b and mixer 1230 to measure the power of the RF signal from these components. The power measurements are then provided to bias control circuit 1280 which use the information to adjust the IIP3 operating point of any component operating past a predetermined level of non-linearity. In the second embodiment of this receiver setting scheme, power detectors can be connected to the output of mixer 1230 and demodulator 1250 to measure the power of the RF signal and baseband signal, respectively, from these components. The power measurements are also provided to bias control circuit 1280. The

TABLE 1

Receiver Control for Cellular Operating Modes

| IDLE/ | FM/ | LNA_RANGE | LNA 1320a Vbias1 | LNA 1320a Vbias2 | LNA 1320b Vbias1 | LNA 1320b Vbias2 | Operating Mode |
|---|---|---|---|---|---|---|---|
| 0 | 0 | 0 | 0 | 1 | 1 | 0 | FM Rx |
| 0 | 0 | 1 | 0 | 0 | 1 | 0 | FM Rx |
| 0 | 1 | 0 | 1 | 0 | 1 | 1 | CDMA Slotted |
| 0 | 1 | 1 | 0 | 0 | 1 | 1 | CDMA Slotted |
| 1 | 0 | 0 | 0 | 1 | 1 | 0 | FM Rx/Tx |
| 1 | 0 | 1 | 0 | 0 | 1 | 0 | FM Rx/Tx |
| 1 | 1 | 0 | 1 | 1 | 1 | 1 | CDMA Rx/Tx |
| 1 | 1 | 1 | 0 | 0 | 1 | 1 | CDMA Rx/Tx |

When BAND_SELECT is set to 1 (PCS band), the telephone operates in one of the PCS operating modes listed in Table 2. While in the PCS mode, the bias current of LNAs 1320a and 1320b are turned OFF to conserve battery power.

difference in power between these two measurements represents the power from the out-of-band signals, which can be used to infer the required IIP3 performance. Bias control circuit 1280 adjusts the operating point of the components in

TABLE 2

Receiver Control for PCS Operating Modes

| IDLE/ | FM/ | LNA_RANGE | LNA 1321a Vbias1 | LNA 1321a Vbias2 | LNA 1321b Vbias1 | LNA 1321b Vbias2 | Operating Mode |
|---|---|---|---|---|---|---|---|
| 0 | 0 | 0 | x | x | x | x | not used |
| 0 | 0 | 1 | x | x | x | x | not used |
| 0 | 1 | 0 | 1 | 0 | 1 | 1 | PCS Slotted |
| 0 | 1 | 1 | 0 | 0 | 1 | 1 | PCS Slotted |
| 1 | 0 | 0 | x | x | x | x | not used |
| 1 | 0 | 1 | x | x | x | x | not used |
| 1 | 1 | 0 | 1 | 1 | 1 | 1 | FCS Rx/Tx |
| 1 | 1 | 1 | 0 | 0 | 1 | 1 | PCS Rx/Tx | the manner described above to maintain the required level of performance. The power detector can be implemented in many manner known in the art, such was a diode detector follow by a lowpass filter.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. A programmable linear receiver comprising:
   (a) an adjustable gain element for receiving an RF signal, the adjustable gain element having a gain control input;
   (b) at least one amplifier stage which:
      (i) is connected to the adjustable gain element, and
      (ii) has a variable IIP3 operating point adjustable by a bias control input;
   (c) a demodulator which:
      (i) is connected to the amplifier, and
      (ii) provides baseband data;
   (d) a non-linearity measurement circuit which:
      (i) is connected to the demodulator, and
      (ii) either:
         (1) measures the RSSI slope, or
         (2) computes a change in the energy-per-chip-to-noise ratio (Ec/Io) versus a change in a level of the RF signal;
   (e) a bias control circuit which is connected to:
      (i) the non-linearity measurement circuit, and
      (ii) the bias control input of the amplifier stage having a variable IIP3 operating point; and
   (f) a gain control circuit connected to the gain control input of the adjustable gain element.

2. The receiver of claim 1 wherein said adjustable gain element is an attenuator.

3. The receiver of claim 1 wherein said non-linearity measurement circuit measures the RSSI slope.

4. The receiver of claim 1 wherein said non-linearity measurement circuit computes a change in the energy-per-chip-to-noise ratio (Ec/Io) versus a change in a level of the RF signal.

5. The receiver of claim 1 further comprising:
   a mixer having a bias control input connected to said bias control circuit, said mixer interposed between said at least one amplifier stage and said demodulator.

6. The receiver of claim 1 further comprising:
   a switch connected in parallel with each of said at least one amplifier stage, said switch having a control input connected to said gain control circuit.

7. The receiver of claim 6 further comprising:
   a pad connected in series with said switch.

8. A method for providing programmable linearity in a receiver comprising the steps of:
   (a) receiving an RF signal;
   (b) attenuating the RF signal by a predetermined level;
   (c) amplifying the RF signal with at least one amplifier to produce an amplified RF signal, the amplifier comprising an active device;
   (d) demodulating the amplified RF signal to obtain an output signal;
   (e) measuring a level of non-linearity in the output signal by:
      (i) measuring an RSSI slope of the output signal; or
      (ii) measuring a change in an energy-per-chip-to-noise ratio (Ec/Io) of the output signal versus a change in the RF input signal level; and
   (f) setting an IIP3 operating point of the active device in accordance with the measured level of non-linearity.

9. The method of claim 8 wherein said setting step is performed in an order determined by a noise figure performance of said receiver.

10. The method of claim 8 wherein said setting step is performed in an order based on signal levels from active devices within said receiver.

11. The method of claim 10 wherein said IIP3 operating point of said active device having a highest output signal level is increased first as said RF signal increases.

12. The method of claim 11 wherein said IIP3 operating point of said active device having a second highest output signal level is increased second as said RF signal increases and said active device having said highest output signal level is increased to a predetermined IIP3 operating point.

13. The method of claim 10 wherein said IIP3 operating point of said active device having a lowest output signal level is decreased first as said RF signal decreases.

14. The method of claim 13 wherein said IIP3 operating point of said active device having a second lowest output signal level is decreased second as said RF signal decreases and said active device having said lowest output signal level is decreased to a predetermined IIP3 operating point.

15. The method of claim 10 wherein said setting step is performed in discrete steps.

16. The method of claim 10 wherein said setting step is performed in continuous manner.

17. The method of claim 8 wherein said measurement step is performed by measuring an RSSI slope of said output signal.

18. The method of claim 17 further comprising the step of:
   comparing said measured RSSI slope with an RSSI slope threshold;
   wherein said setting step is performed in accordance with a result from said comparing step.

19. The method of claim 8 wherein said measurement step is performed by measuring a change in an Ec/Io of said output signal versus a change in the RF input signal level.

20. The method of claim 19 wherein said RSSI slope threshold is set in accordance with a requisite level of performance by said receiver.

21. The method of claim 19 wherein said RSSI threshold is 1.2.

22. The method of claim 19 further comprising the step of:
   averaging said measured RSSI slope over a predetermined period.

23. The method of claim 22 wherein said predetermined period is 5 msec in duration.

24. The method of claim 8 wherein said attenuation step is performed periodically in pulses.

25. The method of claim 24 wherein said pulses are 200 $\mu$sec in duration.

26. The method of claim 8 wherein said predetermined level of said attenuating step is 0.5 dB.

27. The method of claim 8 further comprising the step of:
   turning OFF said at least one amplifier, one at a time as said RF signal exceeds a predetermined threshold.

28. The method of claim 27 wherein said amplifier closest to an input of said receiver is turned OFF first as said RF signal exceeds a predetermined threshold.

29. The method of claim 8 further comprising the steps of:

mixing said amplified RF signal to obtain an IF signal, said mixing step being performed with a mixer comprising an active device; and filtering said IF signal to obtain a filtered IF signal;

wherein said demodulating step is performed on said filtered IF signal.

30. The method of claim 29 wherein said IIP3 operating point of said mixer is increased first as said RF signal increases.

31. The method of claim 29 wherein said IIP3 operating point of said mixer is decreased last as said RF signal decreases.

* * * * *